(12) United States Patent
Ueda

(10) Patent No.: US 6,881,261 B2
(45) Date of Patent: Apr. 19, 2005

(54) METHOD FOR FABRICATING SEMICONDUCTOR DEVICE

(75) Inventor: Tetsuzo Ueda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 33 days.

(21) Appl. No.: 10/292,713

(22) Filed: Nov. 13, 2002

(65) Prior Publication Data

US 2003/0131788 A1 Jul. 17, 2003

(30) Foreign Application Priority Data

Nov. 13, 2001 (JP) ........................................ 2001-346801

(51) Int. Cl.$^7$ ............................................... C30B 25/04
(52) U.S. Cl. ............................ 117/89; 117/95; 117/97; 438/18; 438/468; 438/795
(58) Field of Search ............................ 117/89, 95, 97; 438/18, 468, 795

(56) References Cited

U.S. PATENT DOCUMENTS 5,895,223 A * 4/1999 Peng et al. .................. 438/18
6,701,795 B2 * 6/2000 Cheung et al. .............. 438/458
6,559,075 B1 * 5/2003 Kelly et al. .................. 438/795
6,596,079 B1 * 7/2003 Vaudo et al. .................. 117/97

FOREIGN PATENT DOCUMENTS

| JP | 11-126758 | 5/1999 |
| JP | 11-196174 | 7/1999 |

* cited by examiner

*Primary Examiner*—Felisa Hiteshew
(74) *Attorney, Agent, or Firm*—McDermott Will & Emery LLP

(57) ABSTRACT

A p-type InGaAlN layer, an InGaAlN active layer, and an n-type InGaAlN layer each having a composition represented by $(Al_xGa_{1-x})_yIn_{1-y}N$ ($0 \leq x \leq 1$, $0 \leq y \leq 1$) are formed on a sapphire substrate. In the as-grown state, Mg is bonded to hydrogen atoms in the p-type InGaAlN layer. Then, the back surface of the sapphire substrate is irradiated with a laser beam in a nitrogen atmosphere. The resistance of the p-type InGaAlN layer is reduced by removing hydrogen therefrom with irradiation with a weak laser beam. During the irradiation with the laser beam, the diffusion of a dopant in a multilayer portion is suppressed such that a dopant profile retains sharpness. It is also possible to separate the sapphire substrate from the multilayer portion by subsequently using an intense laser beam for irradiation.

23 Claims, 14 Drawing Sheets

Laser Beam (hv)

Laser Beam (hv)

Laser Beam (hv)

Laser Beam (hν) (E₁ > hν > E₀)

Laser Beam ($h\nu_1, h\nu_2$)  $E_1 > h\nu_1 > E_0$
$h\nu_2 > E_1 > E_0$

Laser Beam (hν)

METHOD FOR FABRICATING SEMICONDUCTOR DEVICE

BACKGROUND OF THE INVENTION

The present invention relates to a method for fabricating a semiconductor device using a nitride semiconductor which functions as a short-wavelength light-emitting diode, a short-wavelength semiconductor laser, a high-temperature and high-speed transistor, or the like.

A nitride semiconductor which is large in optical band gap (e.g., GaN has an optical band gap of about 3.4 eV at a room temperature) has been used conventionally as a material for implementing a visible-range light-emitting diode which emits light in a relatively short wavelength region such as green, blue, or white light or a short-wavelength semiconductor laser which is effective in increasing the capacity of an optical disk. In particular, a nitride semiconductor has been used prevalently for the active layer of a light-emitting diode. As a light source for a read/write operation to a high-density optical disk, the commercialization of a blue or blue-purple laser has been in strong demand.

As a background to the increasing commercial availability and mass producibility of these devices, there have been several technological breakthroughs, one of which is advances in heteroepitaxial growth technology represented by the introduction of a low-temperature buffer layer. If a GaN layer is used, it is necessary to perform crystal growth on a substrate of a different material since a bulk GaN substrate does not exist. Under the circumstances, a method of epitaxially growing the GaN layer by metal organic chemical vapor deposition (MOCVD) on a sapphire substrate has been used widely because the sapphire substrate has a hexagonal structure, similarly to the GaN substrate. In an example of the method, an amorphous AlN layer or a GaN low-temperature buffer layer is formed on a sapphire substrate and then an epitaxially grown layer which is a group III-V compound semiconductor layer forming a principal portion of a device is formed by CVD at a relatively high temperature so that a semiconductor layer having a flat surface and a reduced number crystal defects is obtained.

On the other hand, significant progress has also been made in improving device structures, elucidating the physical phenomenon of crystal growth, or developing a technique for growing a mixed crystal such as InGaN or AlGaN.

Another breakthrough is the implementation of a low-resistance p-type layer. It was previously difficult to implement a p-type GaN layer having a low resistance in an epitaxially grown layer even if the p-type GaN layer is doped with Mg, which is a group II element, as a dopant. However, it has been proved recently that, if annealing is performed with the application of an electron beam or in a nitrogen atmosphere after the formation of the epitaxially grown layer, the p-type GaN layer can be reduced in resistance. It has also been proved that the mechanism of the reduced resistance of the p-type GaN layer is the removal of hydrogen from the p-type GaN layer since impurity atoms are passivated with hydrogen in the p-type GaN layer.

The two breakthroughs described above have allowed a pn junction with an excellent crystalline property to be obtained with high reproducibility so that a light-emitting diode using this has been commercialized and a semiconductor laser using this is close to commercialization.

A description will be given to a method for fabricating the aforementioned nitride semiconductor device. FIGS. 9A to 9C are cross-sectional views illustrating a conventional method for fabricating a nitride semiconductor device.

First, in the step shown in FIG. 9A, an n-type InGaAlN layer 104 having a thickness of about 2 $\mu$m and a composition represented by $(Al_xGa_{1-x})_yIn_{1-y}N$ ($0 \leq x \leq 1$, $0 \leq y \leq 1$) is formed on a sapphire substrate 101 (wafer) by, e.g., metal organic chemical vapor deposition (MOCVD). The n-type InGaAs layer may also be formed after an amorphous AlN buffer layer as thin as about 50 nm is formed at a low temperature of, e.g., about 500° C. The n-type InGaAlN layer 104 includes an n-type GaN layer or an n-type AlGaN clad layer, though it is not depicted. Subsequently, an undoped InGaAlN active layer 103 having a composition represented by $(Al_xGa_{1-x})_yIn_{1-y}N$ ($0 \leq x \leq 1$, $0 \leq y \leq 1$) is formed on the n-type InGaAlN layer 104. The InGaAlN active layer 103 contains, e.g., an InGaN quantum well structure and serves as a region emitting blue or blue-purple light in response to the injection of a current if the semiconductor device is a light-emitting diode or a semiconductor laser. Subsequently, a p-type InGaAlN layer 102 having a thickness of about 2 $\mu$m and a composition represented by $(Al_xGa_{1-x})_yIn_{1-y}N$ ($0 \leq x \leq 1$, $0 \leq y \leq 1$) is formed on the InGaAlN active layer 103. The p-type InGaAlN layer 102 includes a p-type AlGaN clad layer or a p-type GaN layer. Further, an oxide film cap layer 106 composed of a silicon dioxide is formed by CVD on the p-type InGaAlN layer 102.

In the step shown in FIG. 9A, the formation of the p-type InGaAlN layer 102 uses, e.g., $Cp_2Mg$ so that the p-type InGaAlN layer 102 has been doped with Mg. In the as-grown state, Mg atoms are passivated with hydrogen atoms in the p-type InGaAlN layer 102 so that the p-type InGaAlN layer 102 has a high electric resistance. For the removal of hydrogen from the p-type InGaAlN layer 102, it is normally necessary to perform a heat treatment in a gas atmosphere not containing hydrogen.

Next, in the step shown in FIG. 9B, the wafer is retrieved from a crystal growing apparatus and placed in a furnace containing a nitrogen gas atmosphere, e.g., a lamp heat furnace. Then, a heat treatment at a temperature of, e.g., about 700° C. is performed with respect to the wafer by using a heating lamp 10, whereby the p-type InGaAlN layer 102 is reduced in resistance.

Next, in the step shown in FIG. 9C, the oxide film cap layer 106 is removed. Thereafter, a semiconductor laser, a light-emitting diode, or the like is formed by using the p-type InGaAlN layer 102, the InGaAlN active layer 103, and the n-type InGaAlN layer 104.

However, the foregoing method for fabricating a nitride semiconductor has the following problems.

For sufficient activation of the p-type impurity in the p-type InGaAlN layer 102 shown in FIG. 9B, a high temperature on the order of 800° C. is needed. However, since the temperature is equal to a temperature at which the InGaAlN active layer 103 is grown, the degradation of the InGaAlN active layer 103, such as the diffusion of In atoms in the quantum well structure of the InGaAlN active layer 103, may occur. If the temperature for the heat treatment is reduced for the prevention of the degradation, the resistivity of the p-type InGaAlN layer 102 is increased disadvantageously, which causes the problems that de resistances between the p-type InGaAlN layer 102, the InGaAlN active layer 103, and the n-type InGaAlN layer 104 and the contact resistance of an electrode connected to the InGaAlN layer are increased. Briefly, it has been difficult to simultaneously perform the formation of the active layer at a low temperature and the reduction of the resistance of the p-type InGaAlN layer.

SUMMARY OF THE INVENTION

It is therefore an object of the present invention to provide a method for fabricating a semiconductor device which achieves the reduction of the resistance of a p-type group III-V compound semiconductor layer containing nitrogen without degrading an active layer.

The method for fabricating a semiconductor device according to the present invention is a method for fabricating a semiconductor device having a semiconductor layer formed by epitaxial growth from a single-crystal substrate, the method comprising the steps of: (a) forming a multilayer film having at least a first semiconductor layer composed of a group III-V compound doped with a p-type impurity and containing nitrogen and an n-type second semiconductor layer composed of a group III-V compound doped with an n-type impurity and containing nitrogen such that the single-crystal substrate is covered with the multilayer film; and (b) irradiating the first semiconductor layer with a light beam to activate the p-type impurity in the first semiconductor layer.

In accordance with the method, heating performed with irradiation with the light beam, not with the application of radiation heat, is used so that the light beam used for irradiation is absorbed efficiently by the first semiconductor layer containing the impurity to be activated if the energy of the light beam used for irradiation and the irradiation time are determined selectively. This allows selective heating of the first semiconductor layer so that the resistance of the first semiconductor layer is reduced through the removal of hydrogen therefrom without thermally damaging the second semiconductor layer.

The light beam preferably has an energy larger than an optical band gap of a lowermost portion of the first semiconductor layer.

The step (a) includes forming the first semiconductor layer below the second semiconductor layer and the step (b) includes irradiating the first semiconductor layer with the light beam through a back surface of the single-crystal substrate. The arrangement positively prevents thermal damage to the second semiconductor layer.

The step (b) can include varying a power density or energy of the light beam used for the irradiation into two types to activate the p-type impurity in the first semiconductor layer and separate the first semiconductor layer and the single-crystal substrate from each other.

The method further comprises the step of: fixing a recipient substrate to the multilayer structure. The arrangement allows the separation of the recipient substrate that has been fixed to the multilayer portion from the single-crystal substrate. Accordingly, it becomes possible to adjust the respective crystal orientations of the recipient substrate and the multilayer portion such that the respective cleavage planes of the recipient substrate and the multilayer portion are positioned in a common plane. Even if the cleavage plane of the single-crystal substrate is not coincident with the cleavage plane of the multilayer portion or if the single-crystal substrate is composed of a material which is difficult to cleave, the edge portions thereof can be formed with flat cleavage planes by selectively using a material which can be cleaved simultaneously with the multilayer portion to compose the recipient substrate. If the semiconductor device is, e.g., a semiconductor laser, therefore, the semiconductor laser using the flat cleavage planes as the resonator surfaces and having a high light output can be implemented.

The step (b) can include performing a first-stage treatment for activating the p-type impurity in the first semiconductor layer and performing a second-stage treatment for varying a power density or energy of the light beam to separate the first semiconductor layer and the single-crystal substrate from each other.

In that case, the method further comprises, after the first-stage treatment in the step (b) and prior to the second-stage treatment, the step of: fixing a recipient substrate onto the multilayer structure. Accordingly, it becomes possible to adjust the respective crystal orientations of the recipient substrate and the multilayer potion such that the respective cleavage planes of the recipient substrate and the multilayer portion are positioned in a common plane. This achieves the effects described above.

The step (b) includes decomposing or denaturing the first semiconductor layer to form a conductor layer, the method further comprising, after the step (b), the step of: forming an ohmic electrode composed of a conductor material on the conductor layer. The arrangement provides a low-power semiconductor layer with a low contact resistance.

In that case, the method preferably further comprises, after the step (b) and prior to the formation of the ohmic electrode, the step of: etching a surface portion of the conductor layer.

The method further comprises, prior to the step (a), the step of: forming, on the single-crystal substrate, a spacer layer having an optical band gap smaller than an optical band gap of the single-crystal substrate, wherein the step (a) includes forming the multilayer film on the spacer layer and the step (b) includes activating the p-type impurity in the first semiconductor layer and separating the spacer layer and the single-crystal substrate from each other. This suppresses the occurrence of a crystal defect or a crack in the semiconductor layer during the separation of the substrate.

The step (a) includes forming the first semiconductor layer above the second semiconductor layer and the step (b) includes irradiating the first semiconductor layer with the light beam from above the first semiconductor layer. The arrangement achieves the reduction of the resistance of the first semiconductor layer, while minimizing thermal damage to the second semiconductor layer.

The method further comprises, after the step (a), the step of: forming a cap layer on the multilayer portion, wherein the step (b) includes irradiating the first semiconductor layer with the light beam from above the cap layer. This prevents roughness at the surface of the multilayer portion and provides the multilayer portion with excellent flatness.

The method further comprises the steps of: after the step (b), removing the cap layer; fixing a recipient substrate onto the multilayer portion; and after or prior to the fixation of the recipient substrate, irradiating a back surface of the single-crystal substrate with a light beam to separate the single-crystal substrate from the multilayer portion. The arrangement successively promotes the reduction of the resistance of the first semiconductor layer and the separation of the single-crystal substrate.

The light beam used to irradiate the back surface of the substrate is preferably higher in energy than the light beam used for the irradiation from above the multilayer portion in the step (b).

The method further comprises: after the step (b), forming an ohmic electrode composed of a conductor material on the first semiconductor layer. The arrangement achieves a reduction in the contact resistance between the ohmic electrode and the first semiconductor layer.

The step (b) includes decomposing or denaturing the first semiconductor layer to form a conductor layer, the method further comprising the step of: after the step (b), forming an ohmic electrode composed of a conductor material on the conductor layer. This provides the conductor layer lower in resistance than the first semiconductor layer and achieves a reduction in the contact resistance between the ohmic electrode and the conductor layer.

Preferably, the method further comprises: after the step (b) and prior to the formation of the ohmic electrode, etching a surface portion of the conductor layer.

The step (a) includes forming the multilayer portion such that it further has an n-type third semiconductor layer opposing the second semiconductor layer with the first semiconductor layer interposed therebetween and having an optical band gap different from an optical band gap of the first semiconductor layer. This provides a multilayer portion that can be used as each of the regions of a heterojunction bipolar transistor.

In that case, the optical band gap of the third semiconductor layer is larger than the optical band gap of the first semiconductor layer and larger than an energy of the light beam. This allows easy arrival of the light beam at the first semiconductor layer while hardly affecting the third semiconductor layer.

A collector region of a bipolar transistor can be formed from the first semiconductor layer, a base region of the bipolar transistor can be formed from the second semiconductor layer, and an emitter region of the bipolar transistor can be formed from the third semiconductor layer.

In that case, an optical band gap of the emitter region is preferably adjusted to be larger than an optical band gap of the base region.

Preferably, the step (b) is performed in an inert gas atmosphere or in an atmosphere under a reduced pressure.

The light beam used in activating the p-type impurity in the first semiconductor layer has an energy smaller than an optical band gap of the second semiconductor layer. This positively prevents thermal damage to the second semiconductor layer.

A light source of the light beam is a laser which oscillates pulsatively. This allows the use of a laser with a relatively high output and facilitates control of the energy and irradiation time.

The light beam used in activating the p-type impurity in the first semiconductor layer may be a bright line spectrum from a mercury vapor lamp.

The single-crystal substrate is heated during the irradiation with the light beam. This reduces an in-film stress resulting from the different thermal expansion coefficients during the formation of the spacer layer and facilitates the separation of the semiconductor layer formed on the single-crystal substrate having a large area therefrom. In that case, a heating temperature in heating the single-crystal substrate is preferably in the range of 400° C. to 750° C.

The irradiation with the light beam is performed such that a luminous flux scans an entire surface of the single-crystal substrate. This allows easy separation of the single-crystal substrate formed on the single-crystal substrate having a large area therefrom.

The step (a) can include using Mg or Be as a dopant in forming the first semiconductor layer.

The step (a) includes forming the first semiconductor layer in an atmosphere containing hydrogen. This causes the necessity to subsequently remove hydrogen from the first semiconductor layer. In that case also, the resistance of the first semiconductor layer can be reduced by easily removing hydrogen therefrom through the application of the present invention.

Preferably, a substrate selected from a sapphire substrate, an SiC substrate, an MgO substrate, an $LiGaO_2$ substrate, an $LiGa_xAl_{1-x}O_2$ ($0 \leq x \leq 1$) mixed crystal substrate, and an $LiAlO_2$ substrate is used as the single-crystal substrate. The use of the sapphire substrate improves the initial growth of a group III-V compound and allows the formation of a group III-V compound semiconductor layer containing nitrogen and having an excellent crystalline property on the sapphire substrate. If the SiC substrate or the $LiAlO_2$ substrate is used, the lattice constant of the single-crystal substrate becomes closer to that of the group III-V compound semiconductor layer, which allows the formation of the semiconductor layer composed of a group III-V compound containing nitrogen and having an excellent crystalline property.

A substrate selected from an Si substrate, a GaAs substrate, a GaP substrate, and an InP substrate is used as the recipient substrate. This allows easy formation of excellent cleavage planes.

DETAILED DESCRIPTION OF THE INVENTION

Embodiment 1

Figure 1A:
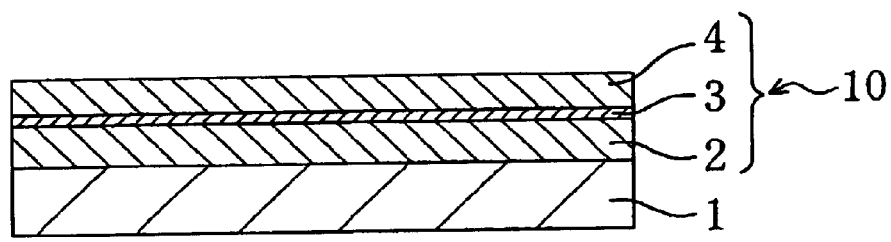
FIGS. 1A to 1C are cross-sectional views illustrating a method for fabricating a semiconductor device using a nitride semiconductor according to a first embodiment of the present invention.
Figure 1B:
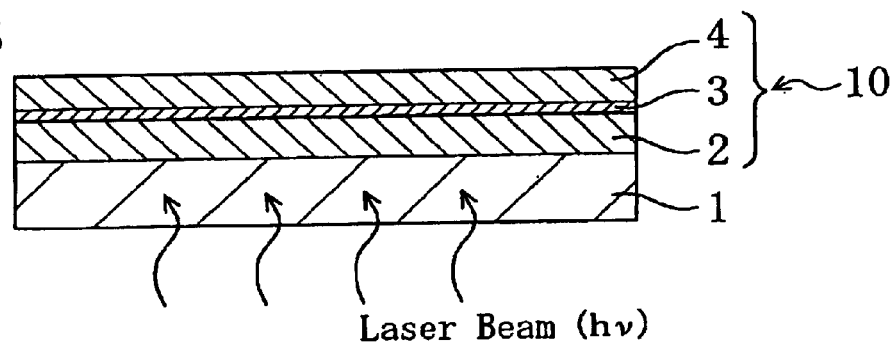
Figure 1C:
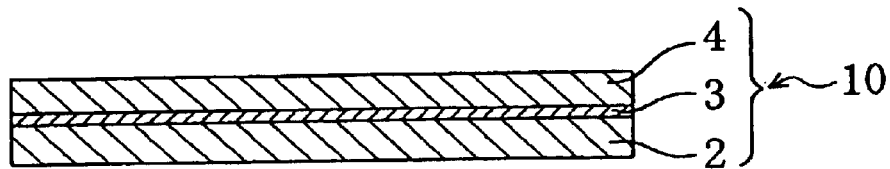

FIGS. 1A to 1C are cross-sectional views illustrating a method for fabricating a semiconductor device using a nitride semiconductor according to a first embodiment of the present invention.

First, in the step shown in FIG. 1A, a p-type InGaAlN layer 2 having a thickness of about 3 μm and a composition represented by $(Al_xGa_{1-x})_yIn_{1-y}N$ ($0 \leq x \leq 1$, $0 \leq y \leq 1$) is formed on a sapphire substrate 1 (wafer) having a principal surface substantially coincident with the (0001) plane by, e.g., metal organic chemical vapor deposition (MOCVD). The p-type InGaAlN layer 2 may also be formed after an amorphous AlN buffer layer or a GaN layer as thin as about 50 nm is formed at a low temperature of, e.g., about 500° C. The p-type InGaAlN layer 2 includes a p-type GaN layer or a p-type AlGaN clad layer, though it is not depicted. In the present embodiment, the p-type InGaAlN layer 2 is formed by upwardly depositing, e.g., a p-type GaN layer, a p-type $(Al_{0.1}Ga_{0.9})N$ clad layer, and a p-type $(Al_{0.1}Ga_{0.9})_{0.9}In_{y0.1}N$ layer in this order.

Subsequently, an undoped InGaAlN active layer 3 having a composition represented by $(Al_xGa_{1-x})_yIn_{1-y}N$ ($0 \leq x \leq 1$, $0 \leq y \leq 1$) is formed on the p-type InGaAlN layer 2. The InGaAlN active layer 3 contains, e.g., an InGaN quantum well structure and serves as a region emitting blue or blue-purple light in response to the injection of a current if the semiconductor device is a light-emitting diode or a semiconductor laser. Subsequently, an n-type InGaAlN layer 4 having a thickness of about 0.5 μm and a composition represented by $(Al_xGa_{1-x})_yIn_{1-y}N$ ($0 \leq x \leq 1$, $0 \leq y \leq 1$) is formed on the InGaAlN active layer 3. The n-type InGaAlN layer 4 includes an n-type AlGaN clad layer or an n-type GaN layer. By the foregoing process, a multilayer portion 10 composed of the p-type InGaAlN layer 2, the InGaAlN active layer 3, and the n-type InGaAlN layer 4 is formed.

In the foregoing process, Si and Mg have been added as dopants in forming the n-type layers and the p-type layers, respectively. When epitaxial growth is performed by MOCVD, a hydrogen gas is used as a carrier gas. In the as-grown state, Mg is bonded to hydrogen atoms in the p-type InGaAlN layer 2 and hence a p-type impurity in the p-type InGaAlN layer 2 is not activated so that the p-type InGaAlN layer 2 has a high electric resistance.

Next, in the step shown in FIG. 1B, the back surface of the sapphire substrate 1 is irradiated with a beam (luminous flux) of a KrF excimer laser (at a wavelength of 248 nm) in a nitrogen atmosphere.

Figure 2:
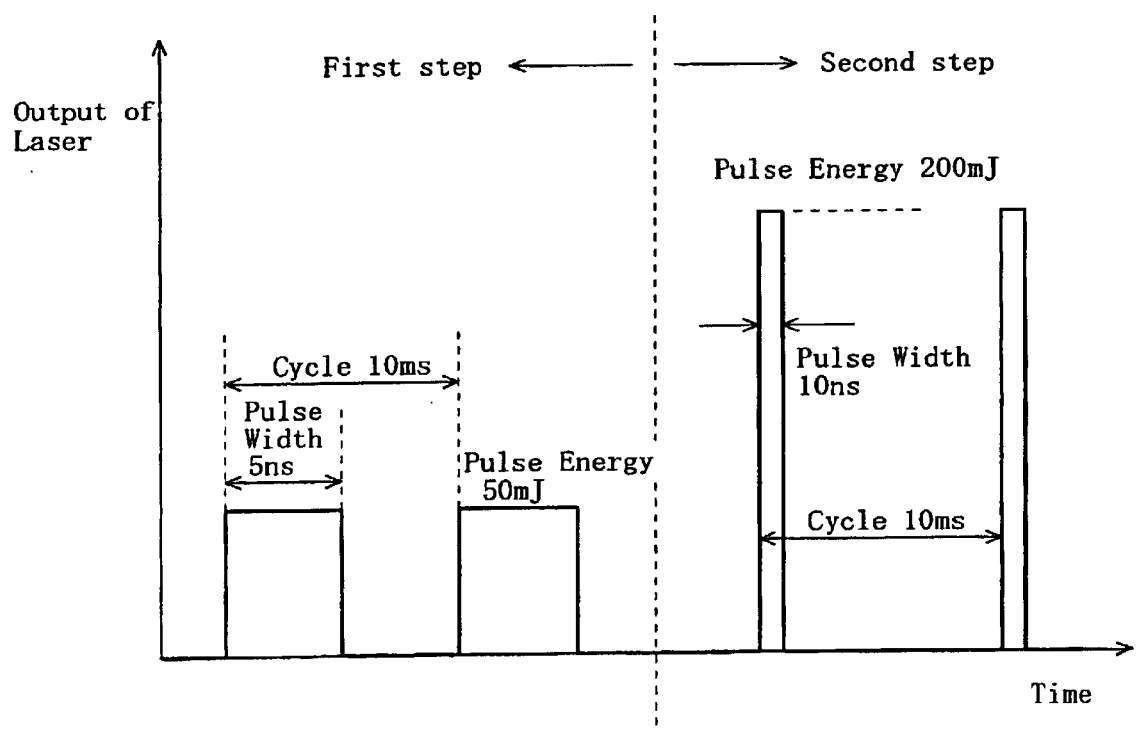
FIG. 2 is a view showing a time-varying output of a KrF excimer laser used for irradiation in the first embodiment.

FIG. 2 is a view showing a time-varying output of the KrF excimer laser used for irradiation. As shown in the drawing, a laser having, e.g., a pulse energy of 50 mJ and a pulse width of 5 ms, i.e., a laser having a relatively low output and a large pulse width is used for irradiation in the first stage. As a result, the p-type InGaAlN layer 2 absorbs the laser beam to be heated so that hydrogen in the p-type InGaAlN layer 2 is removed from the film and the resistance of the p-type InGaAlN layer 2 is thereby reduced.

In the subsequent second stage, the pulse energy of the laser beam is increased to 200 mJ and the pulse width of the laser beam is reduced to 10 ns. Irradiation with the laser beam in the second stage decomposes the film in the region of the p-type InGaAlN layer 2 adjacent the interface with the sapphire substrate 1.

Instead of using the laser of two distinct pulses for irradiation in the first and second stages, a laser of a pulse having a pulse width (time) which gradually increases may also be used instead for irradiation.

In this step, irradiation is performed such that the laser beam (luminous flux) scans the entire surface of the wafer. The entire wafer has been heated to about 500° C. for a reduction in in-film stress resulting from the different thermal expansion coefficients of the sapphire substrate 1 and the individual layers 2, 3, and 4 composing the multilayer portion 10. The heating temperature is preferably in the range of 400° C. to 750° C. such that the stress-reducing function is performed without inducing the degraded properties of the individual layers on the substrate and significant deformation thereof.

Then, in the step shown in FIG. 1C, the sapphire substrate 1 is separated (substrate separation) from the multilayer portion 10 (including the p-type InGaAlN layer 2, the InGaAlN active layer 3, and the n-type InGaAlN layer 4). Thereafter, a light-emitting diode or semiconductor laser using the p-type InGaAlN layer 2, the InGaAlN active layer 3, and the n-type InGaAlN layer 4 in the multilayer portion 10 is formed. In the formation process, a conventionally well-known technique can be used.

Thus, the present embodiment achieves the reduction of the resistance of the p-type InGaAlN layer 2 by irradiating the back surface of the sapphire substrate 1 with the laser. By adjusting the energy and pulse width of the laser beam used for irradiation, each of the layers composing the multilayer portion is prevented from being heated to a high temperature. By thus suppressing the diffusion of the dopants in the multilayer portion 10, the dopant profiles can retain sharpness. This allows a device with an excellent property (a light-emitting diode or semiconductor laser with an excellent light-emitting property) to be implemented.

By varying the power energy and pulse width of the semiconductor laser beam used for irradiation in the second stage of the step shown in FIG. 1B, the sapphire substrate 1 can be separated at the interface between the sapphire substrate 1 and the p-type InGaAlN layer 2. This simultaneously allows the reduction of the resistance and the substrate separation.

It is also possible to form an electrode in each of the p-type InGaAlN layer 2 and n-type InGaAlN layer 4 of the multilayer portion 10. If the p-type InGaAlN layer 2, the InGaAlN layer 3, and the n-type InGaAlN layer 4 are mounted on an insulating substrate and an electrode which comes in contact with that one of the p-type and n-type InGaAlN layers 2 and 4 positioned lower in level is formed, it is necessary to etch the InGaAlN layer and the InGaAlN active layer positioned thereabove. By contrast, the present embodiment does not need such an etching process so that the chip size as well as the fabrication cost can be reduced.

After the step shown in FIG. 1C, the multilayer portion 10 composed of the p-type InGaAlN layer 2, the InGaAlN layer 3, and the n-type InGaAlN layer 4 may also be mounted on an Si substrate or the like. In that case, heat dissipation can be improved by selectively using a material higher in heat conductivity than the sapphire substrate to compose the substrate. The improved heat dissipation implements a high power operation in, e.g., a light-emitting diode or a semiconductor laser.

Conventionally, the lowermost part of the multilayer portion has been an n-type layer because, when an undoped InGaAlN layer (GaN layer) is formed on a sapphire substrate, it is easily changed into an n-type layer and the activation of an impurity is considered to be difficult unless a p-type layer is formed closer to the upper surface of the multilayer portion. In the present invention, however, a p-type layer may be in the lowermost part of the multilayer portion or in the uppermost part thereof since the p-type impurity in the p-type layer can be activated with irradiation with the laser beam. Hence, the conductivity type of each of the layers included in the multilayer film can be selected easily.

Embodiment 2

FIGS. 3A to 3D are cross-sectional views illustrating a method for fabricating a semiconductor device using a nitride semiconductor according to a second embodiment of the present invention.

Figure 3A:
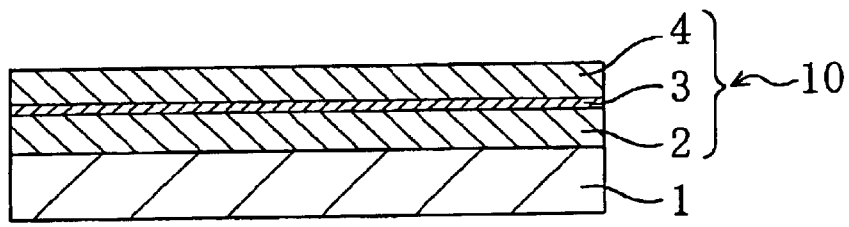
FIGS. 3A to 3D are cross-sectional views illustrating a method for fabricating a semiconductor device using a nitride semiconductor according to a second embodiment of the present invention.

First, in the step shown in FIG. 3A, a p-type InGaAlN layer 2 having a thickness of about 2 µm and a composition represented by $(Al_xGa_{1-x})_yIn_{1-y}N$ ($0 \leq x \leq 1$, $0 \leq y \leq 1$) is formed on a sapphire substrate 1 (wafer) having a principal surface substantially coincident with the (0001) plane by, e.g., metal organic chemical vapor deposition (MOCVD). The p-type InGaAs layer 2 may also be formed after an amorphous AlN buffer layer as thin as about 50 nm is formed at a low temperature of, e.g., about 500° C. The p-type InGaAlN layer 2 includes a p-type GaN layer or a p-type AlGaN clad layer, though it is not depicted. Subsequently, an undoped InGaAlN active layer 3 having a composition represented by $(Al_xGa_{1-x})_yIn_{1-y}N$ ($0 \leq x \leq 1$, $0 \leq y \leq 1$) is formed on the p-type InGaAlN layer 2. The InGaAlN active layer 3 contains, e.g., an InGaN quantum well structure and serves as a region emitting blue or blue-purple light in response to the injection of a current if the semiconductor device is a light-emitting diode or a semiconductor laser. Subsequently, an n-type InGaAlN layer 4 having a thickness of about 0.5 µm and a composition represented by $(Al_xGa_{1-x})_yIn_{1-y}N$ ($0 \leq x \leq 1$, $0 \leq y \leq 1$) is formed on the InGaAlN active layer 3. The n-type InGaAlN layer 4 includes an n-type AlGaN clad layer or an n-type GaN layer. By the foregoing process, a multilayer portion 10 composed of the p-type InGaAlN layer 2, the InGaAlN active layer 3, and the n-type InGaAlN layer 4 is formed.

In the foregoing process, Si and Mg have been added as dopants in forming the n-type layers and the p-type layers, respectively. When epitaxial growth is performed by MOCVD, a hydrogen gas is used as a carrier gas. In the as-grown state, Mg is bonded to hydrogen atoms in the p-type InGaAlN layer 2 (inactivated) so that the p-type InGaAlN layer 2 has a high electric resistivity.

Figure 3B:
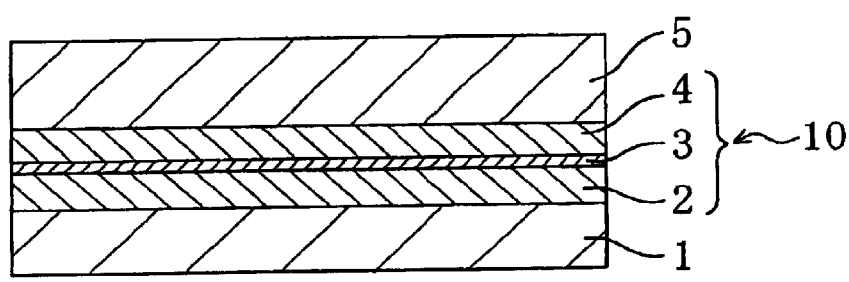

Next, in the step shown in FIG. 3B, the n-type InGaAlN layer 4 is adhered to an Si substrate 5 (recipient substrate) having a principal surface substantially coincident with the (001) plane by using a well-known bonding technique.

If a semiconductor laser is to be fabricated, the InGaAlN layer and the Si substrate are adhered to each other such that the <11-20> direction of the InGaAlN layer and the <110> direction of the Si substrate are in parallel relation for easy cleavage.

Figure 3C:
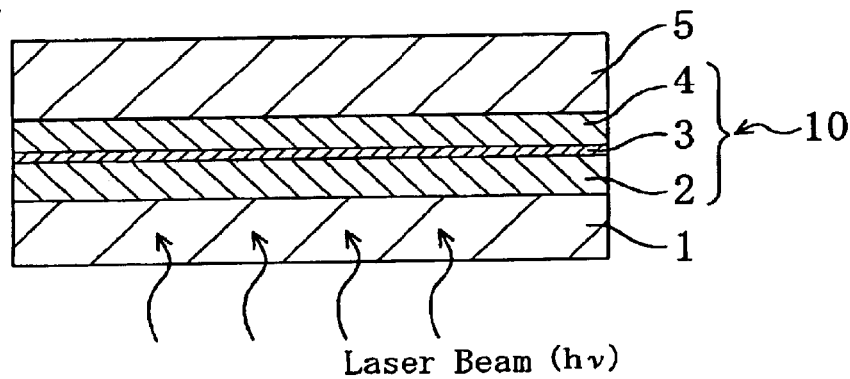

Next, in the step shown in FIG. 3C, the back surface of the sapphire substrate 1 is irradiated with a beam (luminous flux) of a KrF excimer laser (at a wavelength of 248 nm) in a nitrogen atmosphere. In this step, if irradiation with the laser beam is performed by, e.g., varying the laser beam in first and second stages as shown in FIG. 2 illustrating the first embodiment, it becomes possible to reduce the resistance of the p-type InGaAlN layer 2 by removing hydrogen therefrom in the first step and separate the sapphire substrate 1 from the InGaAlN layers 3 and 4 in the second step.

Instead of using the laser beam of two distinct pulses for irradiation in the first and second stages, a laser beam of a pulse having a pulse width (time) which gradually increases may also be used instead for irradiation.

In this step, irradiation is performed such that the laser beam (luminous flux) scans the entire surface of the wafer. The entire wafer has been heated to about 500° C. for a reduction in in-film stress resulting from the different thermal expansion coefficients of the sapphire substrate 1 and the individual layers composing the multilayer portion 10. The heating temperature is preferably in the range of 400° C. to 750° C. such that the stress-reducing function is performed without inducing the degraded properties of the individual layers on the substrate and significant deformation thereof.

The optical density of the KrF excimer laser used herein is preferably 600 mJ/cm$^2$ or more.

Figure 3D:
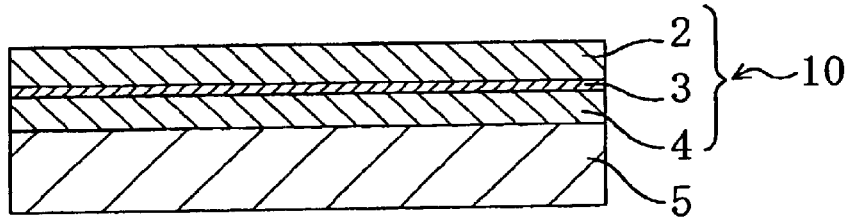

Then, in the step shown in FIG. 3D, the sapphire substrate 1 is separated (substrate separation) from the multilayer portion 10 (including the p-type InGaAlN layer 2, the InGaAlN active layer 3, and the n-type InGaAlN layer 4) and the Si substrate 5.

Alternatively, the Si substrate 5 may also be adhered after the separation of the sapphire substrate 1 is completed with irradiation with the laser beam in the second stage.

Thereafter, a light-emitting diode or semiconductor laser using the p-type InGaAlN layer 2, the InGaAlN active layer 3, and the n-type InGaAlN layer 4 in the multilayer portion 10 is formed. In the formation process, a conventionally well-known technique can be used.

Thus, the present embodiment achieves the reduction of the resistance of the p-type InGaAlN layer 2 by irradiating the back surface of the sapphire substrate 1 with the laser beam, similarly to the first embodiment. By adjusting the energy and pulse width of the laser beam used for irradiation, each of the layers composing the multilayer portion is prevented from being heated to a high temperature. By thus suppressing the diffusion of the dopants in the multilayer portion 10, the dopant profiles can retain sharpness. This allows a device with an excellent property (a light-emitting diode or semiconductor laser with an excellent light-emitting property) to be implemented.

By varying the power energy and pulse width of the semiconductor laser beam used for irradiation in the second stage of the step shown in FIG. 3C, the sapphire substrate 1 can be separated at the interface between the sapphire substrate 1 and the p-type InGaAlN layer 2. This simultaneously allows the reduction of the resistance and the substrate separation.

Since the multilayer portion 10 composed of the p-type InGaAlN layer 2, the InGaAlN active layer 3, and the n-type InGaAlN layer 4 has been mounted on the Si substrate 5, if a semiconductor laser is fabricated subsequently by using the resulting structure, a cleavage plane with excellent flatness is obtainable by adjusting the respective crystal orientations of the cleavage planes of the individual layers composing the multilayer portion 10 (especially the InGaAlN active layer 3) and the cleavage plane of the Si substrate 5 such that they are substantially coincident. This provides the semiconductor laser with an excellent resonator. By using the thermal conductivity of the Si substrate 5 which is higher than that of the sapphire substrate 1, a high-performance semiconductor laser having a low threshold current or performing a high power operation can be implemented.

Embodiment 3

Figure 4A:
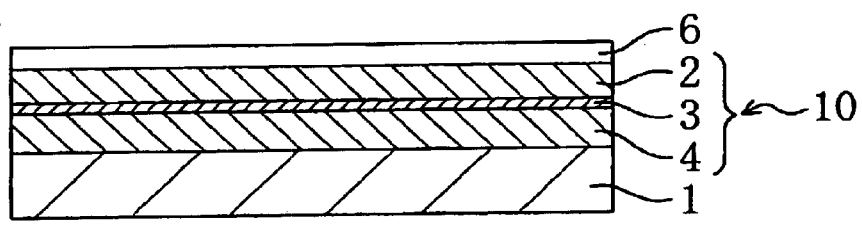
FIGS. 4A to 4C are cross-sectional views illustrating a method for fabricating a semiconductor device using a nitride semiconductor according to a third embodiment of the present invention.
Figure 4B:
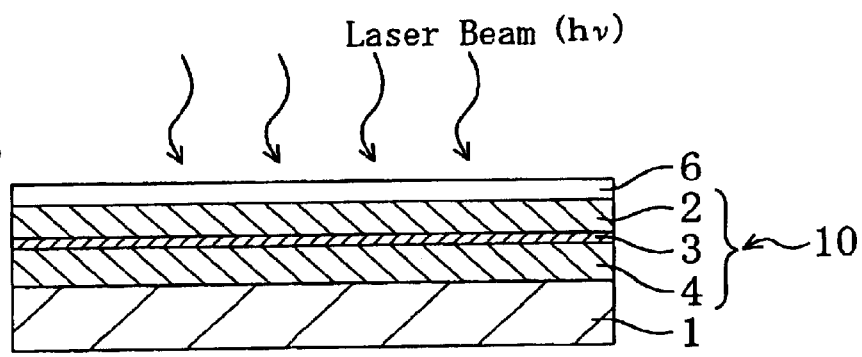
Figure 4C:
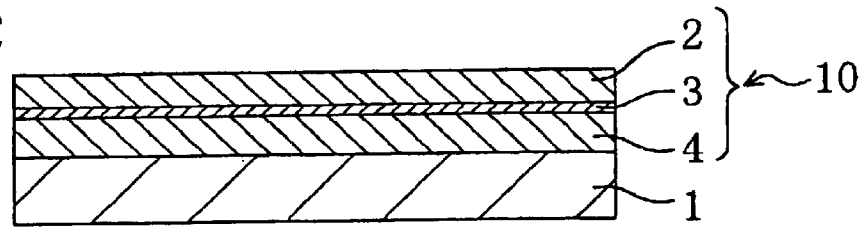

FIGS. 4A to 4C are cross-sectional views illustrating a method for fabricating a semiconductor device using a nitride semiconductor according to a third embodiment of the present invention.

First, in the step shown in FIG. 4A, an n-type InGaAlN layer 4 having a thickness of about 3 μm and a composition represented by $(Al_xGa_{1-x})_yIn_{1-y}N$ ($0 \leq x \leq 1$, $0 \leq y \leq 1$) is formed on a sapphire substrate 1 (wafer) having a principal surface substantially coincident with the (0001) plane by, e.g., metal organic chemical vapor deposition (MOCVD). The n-type InGaAs layer 4 may also be formed after an amorphous AlN buffer layer as thin as about 50 nm is formed at a low temperature of, e.g., about 500° C. The n-type InGaAlN layer 4 includes an n-type GaN layer or an n-type AlGaN clad layer, though it is not depicted. Subsequently, an undoped InGaAlN active layer 3 having a composition represented by $(Al_xGa_{1-x})_yIn_{1-y}N$ ($0 \leq x \leq 1$, $0 \leq y \leq 1$) is formed on the p-type InGaAlN layer 2. The InGaAlN active layer 3 contains, e.g., an InGaN quantum well structure and serves as a region emitting blue or blue-purple light in response to the injection of a current if the semiconductor device is a light-emitting diode or a semiconductor laser. Subsequently, a p-type InGaAlN layer 2 having a thickness of about 0.5 μm and a composition represented by $(Al_xGa_{1-x})_yIn_{1-y}N$ ($0 \leq x \leq 1$, $0 \leq y \leq 1$) is formed on the p-type InGaAlN active layer 3. The p-type InGaAlN layer 2 includes a p-type AlGaN clad layer or a p-type GaN layer. By the foregoing process, a multilayer portion 10 composed of the p-type InGaAlN layer 2, the InGaAlN active layer 3, and the n-type InGaAlN layer 4 is formed.

Further, an oxide film cap layer 6 composed of a silicon dioxide and having a thickness of about 100 nm is formed by CVD on the p-type InGaAlN layer 2.

In the foregoing process, Si and Mg have been added as dopants in forming the n-type layers and the p-type layers, respectively. When epitaxial growth is performed by MOCVD, a hydrogen gas is used as a carrier gas. In the as-grown state, Mg is bonded to hydrogen atoms in the p-type InGaAlN layer 2 (inactivated) so that the p-type InGaAlN layer 2 has a high electric resistivity.

Next, in the step shown in FIG. 4B, irradiation is performed by applying a KrF excimer laser beam (luminous flux) (at a wavelength of 248 nm) from above the oxide film cap layer 6 in a nitrogen atmosphere. Alternatively, a back surface of the sapphire substrate 1 may also be irradiated with the KrF excimer laser (at a wavelength of 248 nm).

An output power of the laser is adjusted to a level which does not decompose the InGaAlN layers 2, 3, and 4 and only the first-stage irradiation shown in FIG. 2 illustrating the first embodiment is performed. In short, a laser having a relatively low output and a large pulse width is used for irradiation. As a result, the p-type InGaAlN layer 2 absorbs the laser to be heated and hydrogen in the film is removed from the p-type InGaAlN layer 2 so that the resistance of the p-type InGaAlN layer 2 is reduced.

In this step, irradiation is performed such that the laser beam (luminous flux) scans the entire surface of the wafer. The entire wafer has been heated to about 500° C. for a reduction in in-film stress resulting from the different thermal expansion coefficients of the sapphire substrate 1, the individual layers composing the multilayer portion, and the oxide film cap layer 6. The heating temperature is preferably in the range of 400° C. to 750° C. such that the stress-reducing function is performed without inducing the degraded properties of the individual layers on the substrate and significant deformation thereof.

Then, in the step shown in FIG. 4C, the oxide film cap layer 6 is removed by, e.g., a hydrofluoric acid. Thereafter, a light-emitting diode or semiconductor laser using the p-type InGaAlN layer 2, the InGaAlN active layer 3, and the n-type InGaAlN layer 4 in the multilayer portion 10 is formed. In the formation process, a conventionally well-known technique can be used.

Thus, the present embodiment achieves the reduction of the resistance of the p-type InGaAlN layer 2 with irradiation with the laser through the oxide film cap layer 6. By adjusting the energy and pulse width of the applied laser, each of the layers composing the multilayer portion 10 is prevented from being heated to a high temperature. By thus suppressing the diffusion of the dopants in the multilayer portion 10, the dopant profiles can retain sharpness. This allows a device with an excellent property (a light-emitting diode or semiconductor laser with an excellent light-emitting property) to be implemented.

Since the present embodiment has performed irradiation with the laser after the formation of the oxide film cap layer 6, it is free of such problems as a rough surface or decomposition resulting from a raised temperature so that a flat surface is formed.

Embodiment 4

FIGS. 5A to 5F are cross-sectional views illustrating a method for fabricating a semiconductor device using a nitride semiconductor according to a fourth embodiment of the present invention.

Figure 5A:
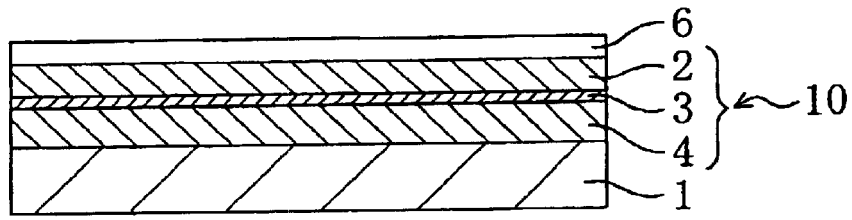
FIGS. 5A to 5F are cross-sectional views illustrating a method for fabricating a semiconductor device using a nitride semiconductor according to a fourth embodiment of the present invention.

First, in the step shown in FIG. 5A, an n-type InGaAlN layer 4 having a thickness of about 3 μm and having a composition represented by $(Al_xGa_{1-x})_yIn_{1-y}N$ ($0 \leq x \leq 1$, $0 \leq y \leq 1$) is formed on a sapphire substrate 1 (wafer) having a principal surface substantially coincident with the (0001) plane by, e.g., metal organic chemical vapor deposition (MOCVD). The n-type InGaAs layer 4 may also be formed after an amorphous AlN buffer layer as thin as about 50 nm is formed at a low temperature of, e.g., about 500° C. The n-type InGaAlN layer 4 includes an n-type GaN layer or an n-type AlGaN clad layer, though it is not depicted. Subsequently, an undoped InGaAlN active layer 3 having a composition represented by $(Al_xGa_{1-x})_yIn_{1-y}N$ ($0 \leq x \leq 1$, $0 \leq y \leq 1$) is formed on the p-type InGaAlN layer 2. The InGaAlN active layer 3 contains, e.g., an InGaN quantum well structure and serves as a region emitting blue or blue-purple light in response to the injection of a current if the semiconductor device is a light-emitting diode or a semiconductor laser. Subsequently, a p-type InGaAlN layer 2 having a thickness of about 0.5 μm and a composition represented by $(Al_xGa_{1-x})_yIn_{1-y}N$ ($0 \leq x \leq 1$, $0 \leq y \leq 1$) is formed on the p-type InGaAlN active layer 3. The p-type InGaAlN layer 2 includes a p-type AlGaN clad layer or a p-type GaN layer. By the foregoing process, a multilayer portion 10 composed of the p-type InGaAlN layer 2, the InGaAlN active layer 3, and the n-type InGaAlN layer 4 is formed.

Further, an oxide film cap layer 6 composed of a silicon dioxide and having a thickness of about 100 nm is formed by CVD on the p-type InGaAlN layer 2.

In the foregoing process, Si and Mg have been added as dopants in forming the n-type layers and the p-type layers, respectively. When epitaxial growth is performed by MOCVD, a hydrogen gas is used as a carrier gas. In the as-grown state, Mg is bonded to hydrogen atoms in the p-type InGaAlN layer 2 (inactivated) so that the p-type InGaAlN layer 2 has a high electric resistivity.

Figure 5B:
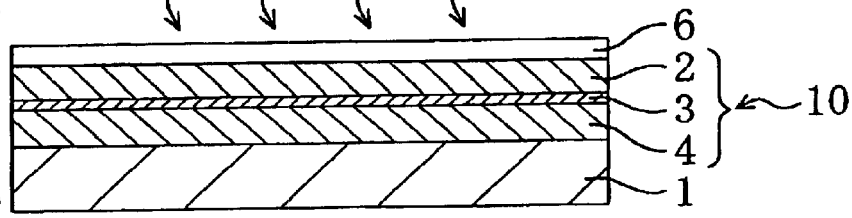

Next, in the step shown in FIG. 5B, irradiation is performed by applying a beam (luminous flux) of a KrF excimer laser (at a wavelength of 248 nm) from above the oxide film cap layer 6 in a nitrogen atmosphere.

An output power of the laser is adjusted to a level which does not decompose the InGaAlN layers 2, 3, and 4 and only the first-stage irradiation shown in FIG. 2 illustrating the first embodiment is performed. In short, a laser having a relatively low output and a large pulse width is used for irradiation. As a result, the p-type InGaAlN layer 2 absorbs the laser to be heated and hydrogen in the film is removed from the p-type InGaAlN layer 2 so that the resistance of the p-type InGaAlN layer 2 is reduced.

In this step, irradiation is performed such that the laser beam (luminous flux) scans the entire surface of the wafer. The entire wafer has been heated to about 500° C. for a reduction in in-film stress resulting from the different thermal expansion coefficients of the sapphire substrate 1, the individual layers composing the multilayer portion 10, and the oxide film cap layer 6. The heating temperature is preferably in the range of 400° C. to 750° C. such that the stress-reducing function is performed without inducing the degraded properties of the individual layers on the substrate and significant deformation thereof.

Figure 5C:
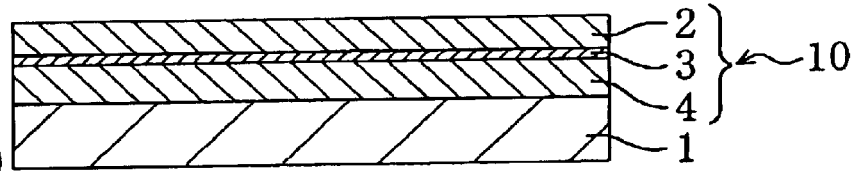

Then, in the step shown in FIG. 5C, the oxide film cap layer 6 is removed by, e.g., a hydrofluoric acid.

Figure 5D:
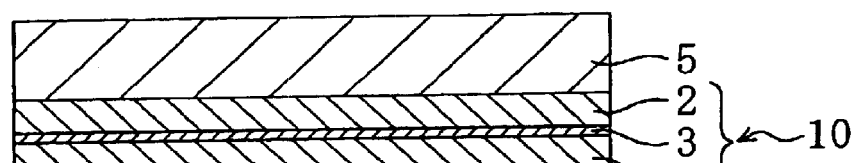

Next, in the step shown in FIG. 5D, the p-type InGaAlN layer 2 is adhered to an Si substrate 5 (recipient substrate) having a principal surface substantially coincident with the (001) plane by using a well-known bonding technique.

If a semiconductor laser is to be fabricated, the InGaAlN layer and the Si substrate are adhered to each other such that the <11–20> direction of the InGaAlN layer and the <110> direction of the Si substrate are parallel with each other for easy cleavage.

Figure 5E:
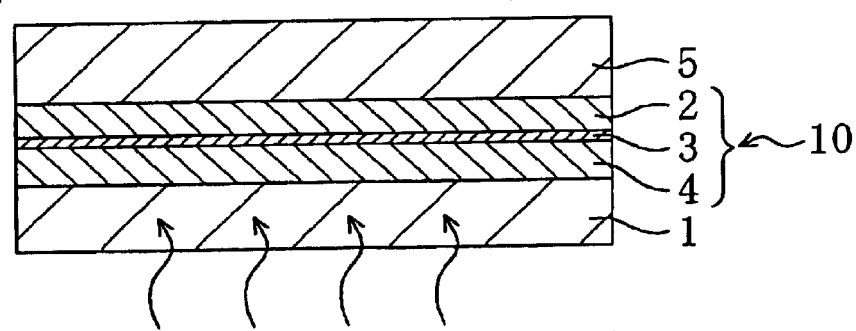

Next, in the step shown in FIG. 5E, the back surface of the sapphire substrate 1 is irradiated with a beam (luminous flux) of a KrF excimer laser (at a wavelength of 248 nm) in a nitrogen atmosphere.

An output power of the laser is adjusted to a level which does not decompose the InGaAlN layers 2, 3, and 4 and only the second-stage irradiation shown in FIG. 2 illustrating the first embodiment is performed. In short, a laser having an high output and a small pulse width is used for irradiation.

In this step, irradiation is performed such that the laser beam (luminous flux) scans the entire surface of the wafer. The entire wafer has been heated to about 500° C. for a reduction in in-film stress resulting from the different thermal expansion coefficients of the sapphire substrate 1, the individual layers composing the multilayer portion 10, and the Si substrate 5. The heating temperature is preferably in the range of 400° C. to 750° C. such that the stress-reducing function is performed without incurring the degraded properties of the individual layers on the substrate and significant deformation thereof.

The optical density of the KrF excimer laser used herein is preferably 600 mJ/cm$^2$ or more.

Figure 5F:
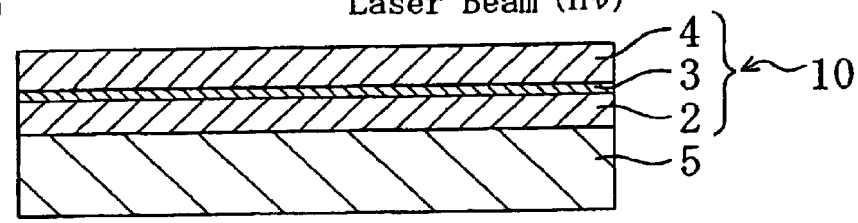

Thus, as in the step shown in FIG. 5F, the sapphire substrate 1 is separated (substrate separation) from the multilayer portion 10 (including the p-type InGaAlN layer 2, the InGaAlN active layer 3, and the n-type InGaAlN layer 4) and the Si substrate 5.

Alternatively, the Si substrate 5 may also be adhered after the separation of the sapphire substrate 1 is completed with irradiation with the laser beam.

Thereafter, a light-emitting diode or semiconductor laser using the p-type InGaAlN layer 2, the InGaAlN active layer 3, and the n-type InGaAlN layer 4 in the multilayer portion 10 is formed. In the formation process, a conventionally well-known technique can be used.

Thus, the present embodiment achieves the reduction of the resistance of the p-type InGaAlN layer 2 with irradiation with the laser through the oxide film cap layer 6. By adjusting the energy and pulse width of the laser, each of the layers composing the multilayer portion 10 is prevented from being heated to a high temperature. By thus suppressing the diffusion of the dopants in the multilayer portion 10, the dopant profiles can retain sharpness. This allows a device with an excellent property (a light-emitting diode or semiconductor laser with an excellent light-emitting property) to be implemented.

Since the present embodiment has performed irradiation with the laser after the formation of the oxide film cap layer 6, it is free of such problems as a rough surface or decomposition resulting from a raised temperature so that a planar surface is formed.

Since the multilayer portion 10 (including the p-type InGaAlN layer 2, the InGaAlN active layer 3, and the n-type InGaAlN layer 4) has been mounted on the Si substrate 5, if a semiconductor laser is fabricated subsequently by using the resulting structure, a cleavage plane with excellent flatness is obtainable by adjusting the respective crystal orientations of the cleavage planes of the InGaAlN layer and the cleavage plane of the Si substrate such that they are substantially coincident. This provides the semiconductor laser with an excellent resonator. By using the thermal conductivity of the Si substrate 5 which is higher than that of the sapphire substrate 1, a high-performance semiconductor laser having a low threshold current or performing a high power operation can be implemented.

Embodiment 5

Figure 6A:
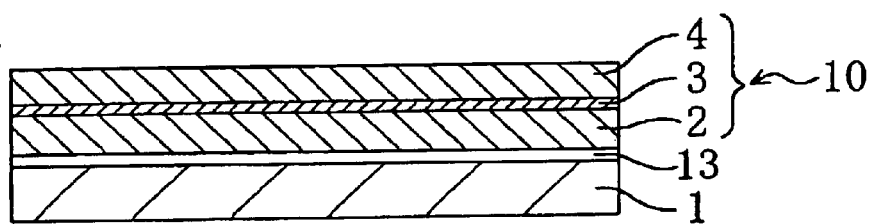
FIGS. 6A to 6C are cross-sectional views illustrating a method for fabricating a semiconductor device using a nitride semiconductor according to a fifth embodiment of the present invention.
Figure 6B:
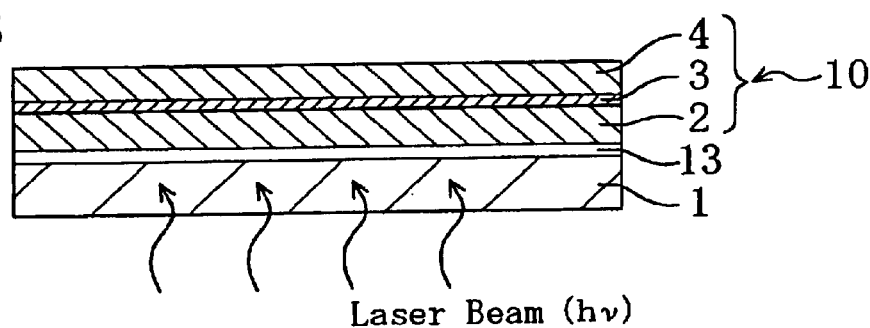
Figure 6C:
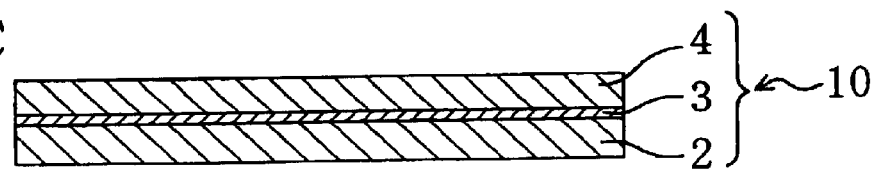

FIGS. 6A to 6C are cross-sectional views illustrating a method for fabricating a semiconductor device using a nitride semiconductor according to a fifth embodiment of the present invention.

First, in the step shown in FIG. 6A, a ZnO layer 13 serving as a spacer layer and having a thickness of about 100 nm is formed on a sapphire substrate 1 (wafer) having a principal surface substantially coincident with the (0001) plane by, e.g., sputtering. A p-type InGaAlN layer 2 having a thickness of about 3 $\mu$m and a composition represented by $(Al_xGa_{1-x})_yIn_{1-y}N$ ($0 \leq x \leq 1$, $0 \leq y \leq 1$) is further formed on the ZnO layer 13 by, e.g., metal organic chemical vapor deposition (MOCVD). The p-type InGaAs layer 2 may also be formed after an amorphous AlN buffer layer as thin as about 50 nm is formed at a low temperature of, e.g., about 500° C. The p-type InGaAlN layer 2 includes a p-type GaN layer or a p-type AlGaN clad layer, though it is not depicted. Subsequently, an undoped InGaAlN active layer 3 having a composition represented by $(Al_xGa_{1-x})_yIn_{1-y}N$ ($0 \leq x \leq 1$, $0 \leq y \leq 1$) is formed on the p-type InGaAlN layer 2. The InGaAlN active layer 3 contains, e.g., an InGaN quantum well structure and serves as a region emitting blue or blue-purple light in response to the injection of a current if the semiconductor device is a light-emitting diode or a semiconductor laser. Subsequently, an n-type InGaAlN layer 4 having a thickness of about 0.5 $\mu$m and a composition represented by $(Al_xGa_{1-x})_yIn_{1-y}N$ ($0 \leq x \leq 1$, $0 \leq y \leq 1$) is formed on the InGaAlN active layer 3. In forming the n-type layers and the p-type layers, Si and Mg have been added as dopants, respectively. By the foregoing process, a multilayer portion 10 composed of the p-type InGaAlN layer 2, the InGaAlN active layer 3, and the n-type InGaAlN layer 4 is formed.

In the foregoing process, Si and Mg have been added as respective dopants in forming the n-type layers and the p-type layers, respectively. When epitaxial growth is performed by MOCVD, a hydrogen gas is used as a carrier gas. In the as-grown state, Mg is bonded to hydrogen atoms in the p-type InGaAlN layer 2 (inactivated) so that the p-type InGaAlN layer 2 has a high electric resistivity.

Next, in the step shown in FIG. 6B, the back surface of the sapphire substrate 1 is irradiated with a beam (luminous flux) of a KrF excimer laser (at a wavelength of 248 nm) in a nitrogen atmosphere in accordance with the same method as shown in FIG. 2.

In a first stage as shown in FIG. 2, a laser having a pulse energy of, e.g., 50 mJ and a pulse width of 5 ms, i.e., a laser having a relatively low output and a large pulse width is used for irradiation. As a result, the p-type InGaAlN layer 2 absorbs the laser beam to be heated so that hydrogen in the p-type InGaAlN layer 2 is removed from the film and the resistance of the p-type InGaAlN layer 2 is thereby reduced. However, the ZnO layer 13 is not decomposed or fused with the laser output.

In the subsequent second stage, the pulse energy of the laser beam is increased to 200 mJ and the pulse width of the laser beam is reduced to 10 ns. Irradiation with the laser beam in the second stage decomposes the film in the region of the p-type InGaAlN layer 2 adjacent the interface with the sapphire substrate 1.

Instead of using the laser of two distinct pulses for irradiation in the first and second stages, a laser of a pulse having a pulse width (time) which gradually increases may also be used instead for irradiation.

In this step, irradiation is performed such that the laser beam (luminous flux) scans the entire surface of the wafer. The entire wafer has been heated to about 500° C. for a reduction in in-film stress resulting from the different thermal expansion coefficients of the sapphire substrate 1 and the individual layers composing the multilayer portion 10. The heating temperature is preferably in the range of 400° C. to 750° C. such that the stress-reducing function is performed without inducing the degraded properties of the individual layers on the substrate and significant deformation thereof.

Then, in the step shown in FIG. 6C, the sapphire substrate 1 is separated (substrate separation) from the multilayer portion 10 (including the p-type InGaAlN layer 2, the InGaAlN active layer 3, and the n-type InGaAlN layer 4) and the ZnO layer 13. Thereafter, a light-emitting diode or semiconductor laser using the p-type InGaAlN layer 2, the InGaAlN active layer 3, and the n-type InGaAlN layer 4 in the multilayer portion 10 is formed. In the formation process, a conventionally well-known technique can be used.

In the present embodiment, the ZnO layer 13 is not decomposed or fused by the energy of the laser used for irradiation in the first stage (see FIG. 2) of the step shown in FIG. 6B. On the other hand, the beam absorbed by the ZnO layer 13 and the p-type InGaAlN layer 2 is conducted as heat to heat the p-type InGaAlN layer 2 so that the p-type InGaAlN layer 2 is reduced in resistance through the removal of hydrogen. Thus, the same effects achieved by the first embodiment are achievable.

The present embodiment can also achieve the following effects in addition to the effects achieved by the first embodiment.

The band gap (optical band gap) of the ZnO layer 13 is 3.27 eV, which is smaller than the band gap (3.39 eV) of the GaN layer composing the lowermost part of the n-type InGaAlN layer 4. Accordingly, the laser beam used to irradiate the back surface of the sapphire substrate 1 in the second stage of the step shown in FIG. 6B is primarily absorbed by the ZnO layer 13 and only a small portion thereof reaches each of the InGaAlN layers 2, 3, and 4. As a consequence, crystal decomposition or fusion occurs in the entire ZnO layer 13 or in the region of the ZnO layer 13 adjacent the interface with the sapphire substrate 1 so that the sapphire substrate 1 is separated from the multilayer portion 10 and the ZnO layer 13 at a low light power density.

Since each of the InGaAlN layers 2, 3, and 4 in the multilayer portion 10 is hardly fused, the occurrence of a crystal defect or a crack in the InGaAlN layers 2, 3, and 4 can be suppressed. Even if the thickness of the whole multilayer portion 10 is reduced to 5 μm or less, therefore, the sapphire substrate 1 can be separated, while the crystalline property of each of the InGaAlN layers 2, 3, and 4 is retained satisfactorily. Since the thickness of the whole multilayer portion 10 is as thin as 5 μm, it is possible to reduce the warping of the substrate caused by the different thermal expansion coefficients of the individual layers composing the multilayer portion 10 and the sapphire substrate 1 during the cooling of the substrate after epitaxial growth. This allows easy and uniform adhesion to a flat Si substrate or the like with high reproducibility.

The low light power density defined herein is a light power density having a value smaller than about 600 mJ/cm$^2$, which is a threshold power density at which the GaN layer in direct contact with the sapphire substrate is separated therefrom when, e.g., a KrF excimer laser beam is used.

As the spacer layer, an amorphous MgO layer may be used instead of the ZnO layer 13. In that case, Mg resulting from the decomposition of MgO upon irradiation with the beam serves as a dopant so that the multilayer portion having a p-type layer in the lowermost part thereof is formed easily.

Embodiment 6

Figure 7A:
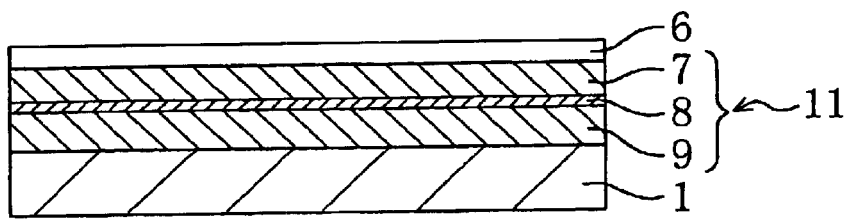
FIGS. 7A to 7C are cross-sectional views illustrating a method for fabricating a semiconductor device using a nitride semiconductor according to a sixth embodiment of the present invention.
Figure 7B:
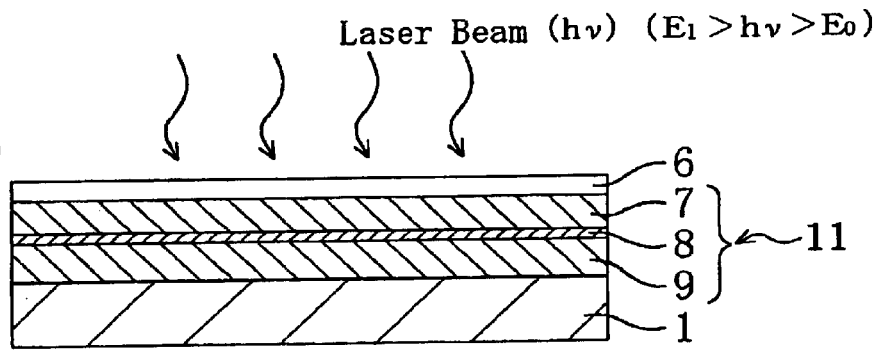
Figure 7C:
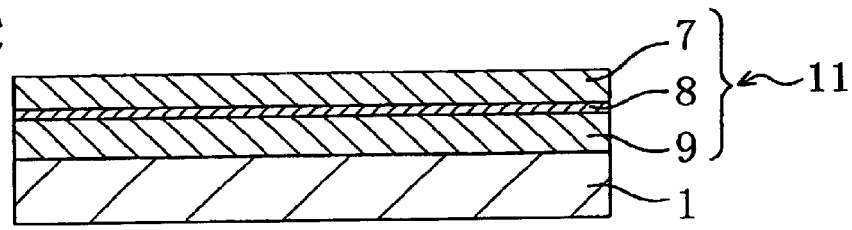

FIGS. 7A to 7C are cross-sectional views illustrating a method for fabricating a semiconductor device using a nitride semiconductor according to a sixth embodiment of the present invention.

First, in the step shown in FIG. 7A, an n-type GaN layer 9 having a thickness of about 2 μm is formed on a sapphire substrate 1 (wafer) having a principal surface substantially coincident with the (0001) plane by, e.g., metal organic chemical vapor deposition (MOCVD). The n-type GaN layer 9 may also be formed after an amorphous AlN buffer layer as thin as about 50 nm is formed at a low temperature of, e.g., about 500° C. In addition, a semi-insulating GaN layer may be provided between the n-type GaN layer 9 and the sapphire substrate 1. Subsequently, a p-type GaN layer 8 having a thickness of about 0.2 μm is formed on the n-type GaN layer 9 and then an n-type Al$_{0.1}$Ga$_{0.9}$N layer 7 having a thickness of about 0.5 μm is formed on the p-type GaN layer 8. By the foregoing process, a multilayer portion 11 composed of the n-type Al$_{0.1}$Ga$_{0.9}$N layer 7, the p-type GaN layer 8, and the n-type GaN layer 9 is formed.

Further, an oxide film cap layer 6 composed of a silicon dioxide and having a thickness of about 100 nm is formed by CVD on the n-type Al$_{0.1}$Ga$_{0.9}$N layer 7.

In the foregoing process, Si and Mg have been added as dopants in forming the n-type layers and the p-type layers, respectively. When epitaxial growth is performed by MOCVD, a hydrogen gas is used as a carrier gas. In the as-grown state, Mg is bonded to hydrogen atoms in the p-type InGaAlN layer 2 (inactivated) so that the p-type InGaAlN layer 2 has a high electric resistivity.

Next, in the step shown in FIG. 7B, irradiation is performed by applying the third harmonic of a YAG laser beam (luminous flux) (at a wavelength of 355 nm corresponding to an energy of 3.49 eV) from above the oxide film cap layer 6 in a nitrogen atmosphere. This removes hydrogen from the p-type GaN layer 8, selectively activates a p-type impurity in the p-type GaN layer 8, and thereby reduces the resistance thereof. Alternatively, the back surface of the sapphire substrate 1 may also be irradiated with the third harmonic of a YAG laser beam.

Since the optical band gap E1 of the $Al_{0.1}Ga_{0.9}N$ layer is 3.57 eV, the energy of the laser used for irradiation is not absorbed by the n-type $Al_{0.1}Ga_{0.9}N$ layer and is mostly absorbed by the p-type GaN layer 8 having an optical band gap E0 of about 3.39 eV. An output power of the laser is adjusted to a level required to cause the removal of hydrogen from the p-type GaN layer 8 so that only the first-stage irradiation shown in FIG. 2 illustrating the first embodiment is performed. In short, a laser having a relatively low output and a small pulse width is used for irradiation.

In this step, irradiation is performed such that the laser beam (luminous flux) scans the entire surface of the wafer. The entire wafer has been heated to about 500° C. for a reduction in in-film stress resulting from the different thermal expansion coefficients of the sapphire substrate 1, the individual layers composing the multilayer portion It, and the oxide film cap layer 6. The heating temperature is preferably in the range of 400° C. to 750° C. such that the stress-reducing function is performed without inducing the degraded properties of the individual layers on the substrate and significant deformation.

Then, in the step shown in FIG. 7C, the oxide film cap layer 6 is removed by, e.g., a hydrofluoric acid. Thereafter, a heterojunction bipolar transistor (HBT) using the n-type GaN layer 9 as a collector region, the p-type GaN layer 8 as a base region, and the n-type $Al_{0.1}Ga_{0.9}N$ layer 7 as an emitter region is formed. In the formation process, a conventionally well-known technique can be used.

If a bright line spectrum at 365 nm (corresponding to an energy of 3.4 eV) from a mercury vapor lamp is used instead for irradiation in the step shown in FIG. 7B, the same effects as achieved in the present embodiment are achievable since the bright line spectrum passes through the $Al_{0.1}Ga_{0.9}N$ layer 7 to be absorbed by the p-type GaN layer 8.

Thus, the present embodiment achieves the reduction of the resistance of the p-type GaN layer 8 with the laser applied through the oxide film cap layer 6. By adjusting the energy and pulse width of the applied laser, each of the layers (especially the $Al_{0.1}Ga_{0.9}N$ layer 7) in the multilayer portion 11 is prevented from being heated to a high temperature. This implements a heavily doped p-type base region, while the dopant profile of each of the layers (especially the emitter region) of the heterojunction bipolar transistor retains sharpness.

Since the present embodiment has performed irradiation with the laser after the formation of the oxide film cap layer 6, it is free of such problems as a rough surface or decomposition of the $Al_{0.1}Ga_{0.9}N$ layer 7 which results from a raised temperature so that the heterobipolar transistor with a flat surface is formed.

The fabrication method according to the present embodiment may also include, after the activation of a p-type impurity in the p-type GaN layer 8, the step of irradiating the back surface of the sapphire substrate 1 with a KrF excimer laser (248 nm) and thereby separating the sapphire substrate 1.

Embodiment 7

FIGS. 8A to 8D are cross-sectional views illustrating a method for fabricating a semiconductor device using a nitride semiconductor according to a seventh embodiment of the present invention.

Figure 8A:
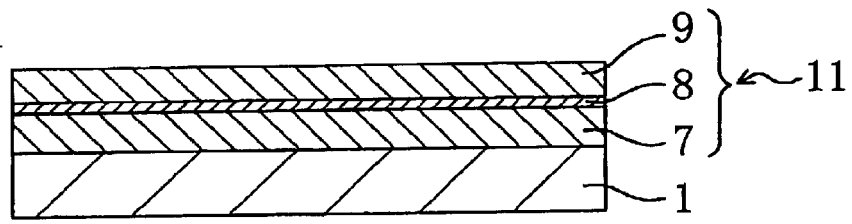
FIGS. 8A to 8D are cross-sectional views illustrating a method for fabricating a semiconductor device using a nitride semiconductor according to a seventh embodiment of the present invention.
Figure 8B:
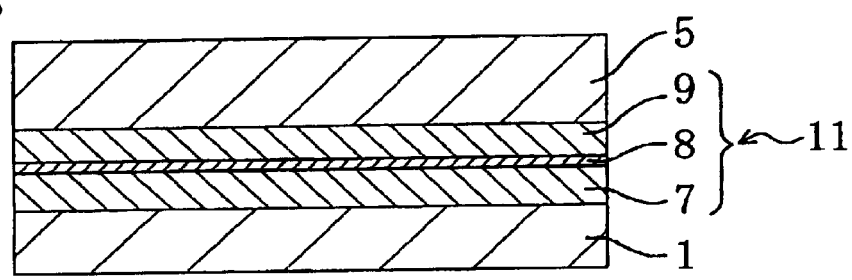

First, in the step shown in FIG. 8A, an n-type $Al_{0.1}Ga_{0.9}N$ layer 7 having a thickness of about 0.5 μm is formed on a sapphire substrate 1 (wafer) having a principal surface substantially coincident with the (0001) plane by, e.g., metal organic chemical vapor deposition (MOCVD). The n-type $Al_{0.1}Ga_{0.9}N$ layer 7 may also be formed after an amorphous AlN buffer layer as thin as about 50 nm is formed at a low temperature of, e.g., about 500° C. In addition, a semi-insulating GaN layer may be provided between the n-type $Al_{0.1}Ga_{0.9}N$ layer 7 and the sapphire substrate 1. Subsequently, a p-type GaN layer 8 having a thickness of about 0.2 μm and an n-type GaN layer 9 having a thickness of about 2 μm are formed successively on the n-type $Al_{0.1}Ga_{0.9}N$ layer 7. By the foregoing process, a multilayer portion 11 composed of the n-type $Al_{0.1}Ga_{0.9}N$ layer 7, the p-type GaN layer 8, and the n-type GaN layer 9 is formed.

In the foregoing process, Si and Mg have been added as dopants in forming the n-type layers and the p-type layers, respectively. When epitaxial growth is performed by MOCVD, a hydrogen gas is used as a carrier gas. In the as-grown state, Mg is bonded to hydrogen atoms in the p-type InGaAlN layer 2 (inactivated) so that the p-type InGaAlN layer 2 has a high electric resistivity.

Next, in the step shown in 8B, an Si substrate 5 having a principal surface coincident with the (001) plane is adhered to the n-type GaN layer 9 by using, e.g., a bonding technique.

Figure 8C:
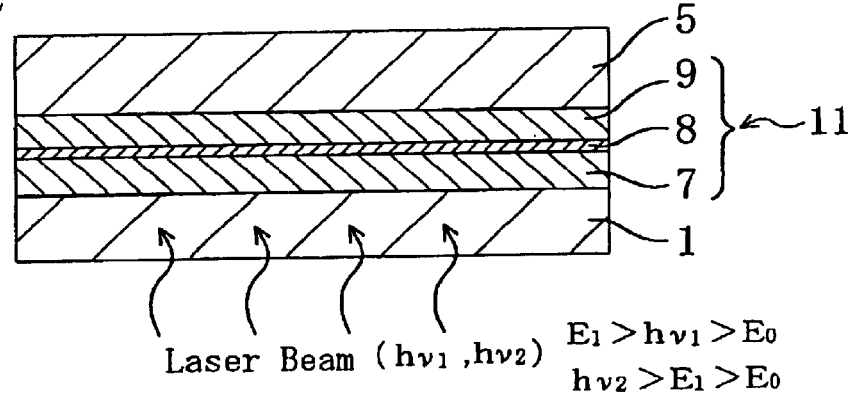

Next, in the step shown in FIG. 8C, the back surface of the sapphire substrate 1 is irradiated with the third harmonic of a YAG laser beam (luminous flux) (at a wavelength of 355 nm corresponding to an energy of 3.49 eV) in a nitrogen atmosphere by varying the output and the time in first and second stages in the same manner as in the first embodiment.

In a stage corresponding to the first stage shown in FIG. 2, the removal of hydrogen from the p-type GaN layer 8 is caused to selectively activate a p-type impurity in the p-type GaN layer 8 and reduce the resistance thereof. Since the optical band gap E1 of the $Al_{0.1}Ga_{0.9}N$ layer is 3.57 eV, the energy of the laser used for irradiation is not absorbed by the n-type $Al_{0.1}Ga_{0.9}N$ layer and is mostly absorbed by the p-type GaN layer 8 having an optical band gap E0 of about 3.39 eV. An output power of the laser is adjusted to a level required to cause the removal of hydrogen from the p-type GaN layer 8 so that a laser having a relatively low output and a large pulse width is used for irradiation in the same manner as in the first stage shown in FIG. 2 illustrating the first embodiment.

Subsequently, a KrF excimer laser having a high energy (at 248 nm corresponding to an energy of 5 eV) which has a higher power density and a smaller pulse width than in the first stage is used for irradiation in a second stage. The irradiation with the laser in the second stage causes the decomposition of the film in the region of the n-type $Al_{0.1}Ga_{0.9}N$ layer 7 adjacent the interface with the sapphire substrate 1.

In this step, irradiation is performed such that the laser beam (luminous flux) scans the entire surface of the wafer. The whole wafer has been heated to about 500° C. for a reduction in in-film stress resulting from the different thermal expansion coefficients of the sapphire substrate 1, the n-type $Al_{0.1}Ga_{0.9}N$ layer 7, the GaN layers 8 and 9, and the Si substrate 5. The heating temperature is preferably in the range of 400° C. to 750° C. such that the stress-reducing function is performed without inducing the degraded properties of the individual layers on the substrate and significant deformation thereof.

Figure 8D:
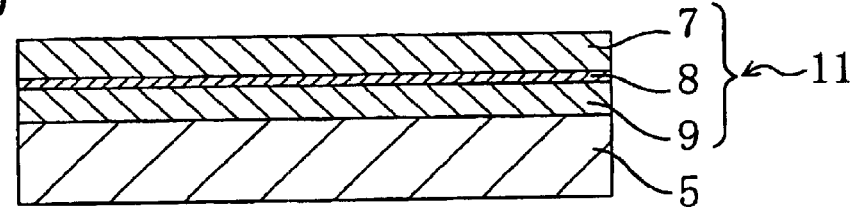

Then, as shown in FIG. 8D, the sapphire substrate 1 is separated from the multilayer portion 11 (the n-type $Al_{0.1}Ga_{0.9}N$ layer 7, the GaN layers 8 and 9, and the Si substrate 5) with irradiation with a KrF laser. This provides a structure composed of the n-type GaN layer 9, the p-type GaN layer 8, and the n-type $Al_{0.1}Ga_{0.9}N$ layer 7 which are stacked successively in layers on the Si substrate 5.

Thereafter, a heterojunction bipolar transistor (HBT) using the n-type GaN layer 9 as a collector region, the p-type GaN layer 8 as a base region, and the n-type $Al_{0.1}Ga_{0.9}N$ layer 7 as an emitter region is formed. In the formation process, a conventionally well-known technique can be used.

Figure 9:
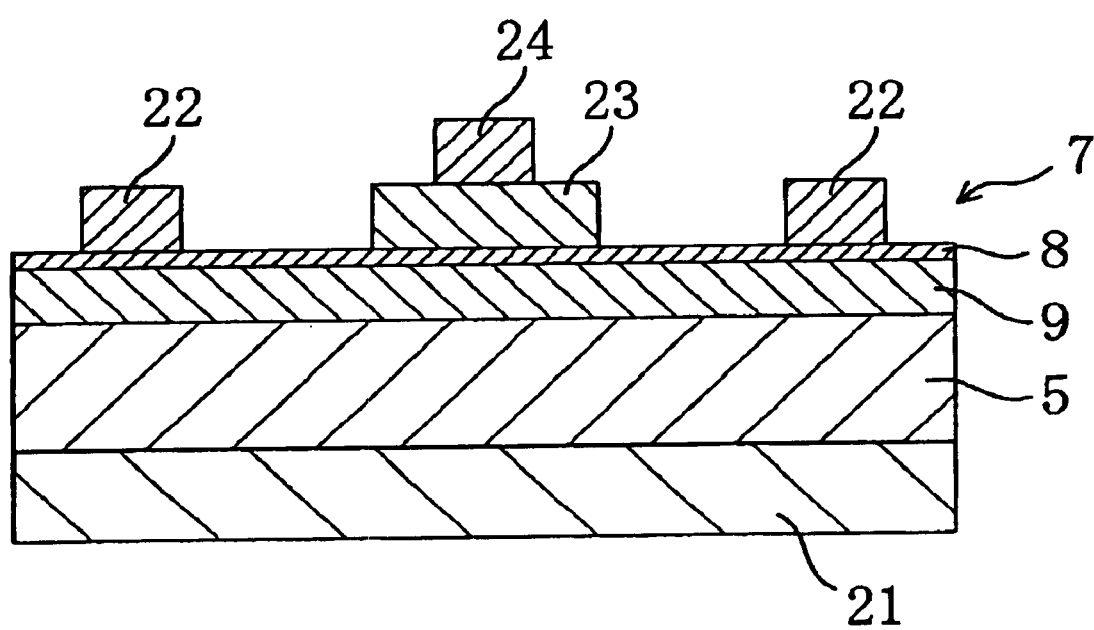
FIG. 9 is a cross-sectional view showing a structure of a heterojunction bipolar transistor formed by fabrication process steps according to the seventh embodiment.
Figure 10A:
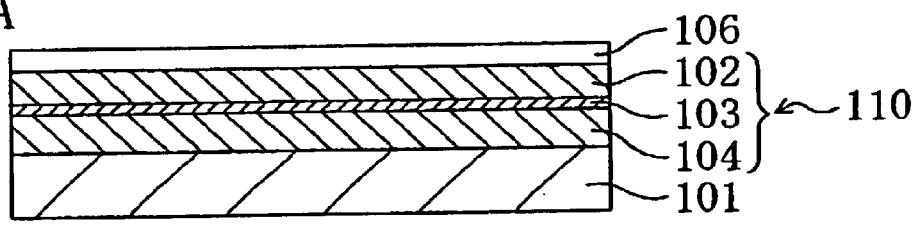
FIGS. 10A to 10C are structural views illustrating a conventional method for fabricating a semiconductor device using a nitride semiconductor.
Figure 10B:
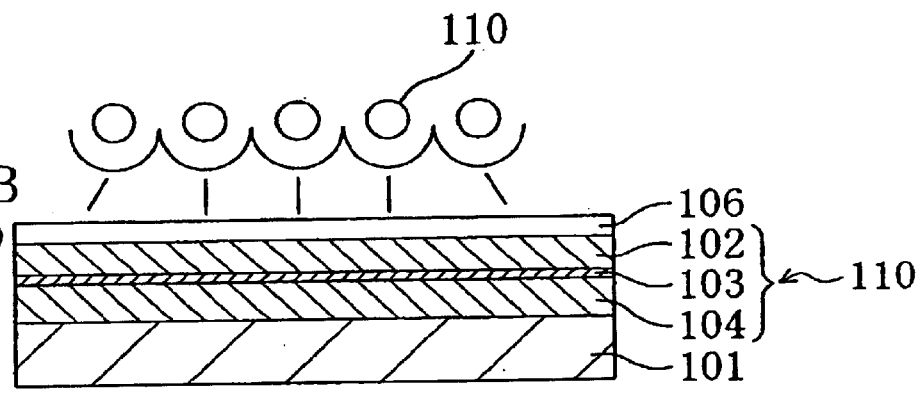
Figure 10C:
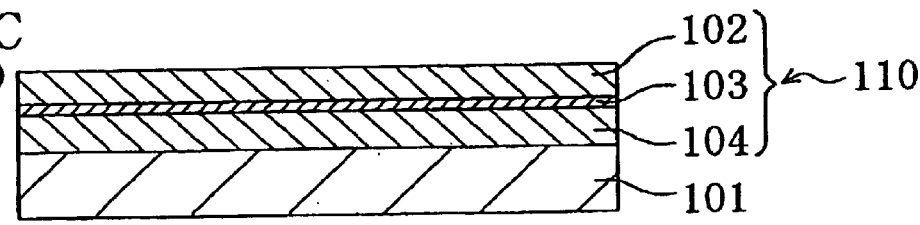

FIG. 9 is a cross-sectional view showing a structure of a heterojunction bipolar transistor formed by fabrication process steps according to the seventh embodiment.

As shown in the drawing, the heterojunction bipolar transistor comprises: a backside electrode 21 composed of a Ti film in contact with the lower surface of an n-type GaN layer 9 (collector layer) and an Al film covering the Ti film; a base electrode 22 composed of a Ni film formed on a p-type GaN layer 8 (base layer) in contact relation therewith and an Au film to cover the Ni film; an emitter layer 23 formed by patterning an n-type $Al_{0.1}Ga_{0.9}N$ layer 7; and an emitter electrode 24 composed of a Ti film provided on the emitter layer 23 in contact relation therewith and an Al film covering the Ti film. Thus, the structure shown in FIG. 9 constitutes an npn-type bipolar transistor.

If a bright line spectrum at 365 nm (corresponding to an energy of 3.4 eV) from a mercury vapor lamp is used instead for irradiation in the first stage of the step shown in FIG. 8C, the same effects as achieved in the present embodiment are achievable since the bright line spectrum passes through the n-type $Al_{0.1}Ga_{0.9}N$ layer 7 to be absorbed by the p-type GaN layer 8.

The adhesion of the Si substrate 5 may also be performed after the separation of the sapphire substrate 1 with irradiation with the laser beam.

Thus, the present embodiment achieves the reduction of the resistance of the p-type GaN layer 8 by irradiating the back surface of the sapphire substrate 1 with the laser. By adjusting the energy and pulse width of the laser used for irradiation, the n-type GaN layer 9 is prevented from being heated to a high temperature. This implements the heterojunction bipolar transistor having an emitter region in which an impurity concentration profile is sharp.

By adhering a substrate excellent in heat dissipation, such as the Si substrate 5, the heterojunction bipolar transistor is allowed to perform a high power operation.

In addition, the present embodiment provides the heterojunction bipolar transistor having an excellent RF characteristic, a reduced contact resistance at the base electrode, and a low base resistance.

Embodiment 8

FIGS. 11A to 11D are cross-sectional views illustrating a method for fabricating a semiconductor device using a nitride semiconductor according to an eighth embodiment of the present invention.

Figure 11A:
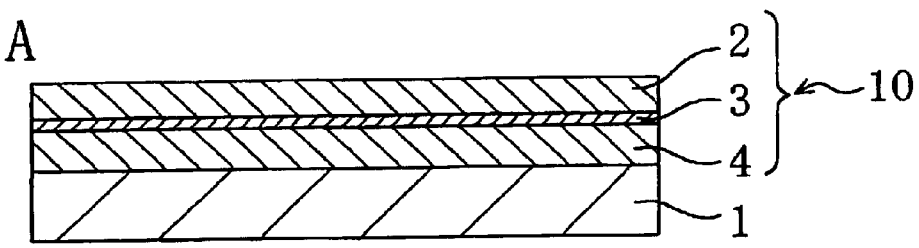
FIGS. 11A to 11D are cross-sectional views illustrating a method for fabricating a semiconductor device using a nitride semiconductor according to an eighth embodiment of the present invention.

First, in the step shown in FIG. 11A, an n-type InGaAlN layer 4 having a thickness of about 3 μm and a composition represented by $(Al_xGa_{1-x})_yIn_{1-y}N$ ($0 \leq x \leq 1$, $0 \leq y \leq 1$) is formed on a sapphire substrate 1 (wafer) having a principal surface substantially coincident with the (0001) plane by, e.g., metal organic chemical vapor deposition (MOCVD). The n-type InGaAs layer 4 may also be formed after an amorphous AlN buffer layer (or a GaN buffer layer) as thin as about 50 nm is formed at a low temperature of, e.g., about 500° C. The n-type InGaAlN layer 4 includes an n-type GaN layer or an n-type AlGaN clad layer, though it is not depicted. Subsequently, an undoped InGaAlN active layer 3 having a composition represented by $(Al_xGa_{1-x})_yIn_{1-y}N$ ($0 \leq x \leq 1$, $0 \leq y \leq 1$) is formed on the p-type InGaAlN layer 2. The InGaAlN active layer 3 contains, e.g., an InGaN quantum well structure and serves as a region emitting blue or blue-purple light in response to the injection of a current if the semiconductor device is a light-emitting diode or a semiconductor laser. Subsequently, a p-type InGaAlN layer 2 having a thickness of about 0.5 μm and a composition represented by $(Al_xGa_{1-x})_yIn_{1-y}N$ ($0 \leq x \leq 1$, $0 \leq y \leq 1$) is formed on the p-type InGaAlN active layer 3. The p-type InGaAlN layer 2 includes a p-type AlGaN clad layer or a p-type GaN layer. By the foregoing process, a multilayer portion 10 composed of the p-type InGaAlN layer 2, the InGaAlN active layer 3, and the n-type InGaAlN layer 4 is formed.

In the foregoing process, Si and Mg have been added as dopants in forming the n-type layers and the p-type layers, respectively. When epitaxial growth is performed by MOCVD, a hydrogen gas is used as a carrier gas. In the as-grown state, Mg is bonded to hydrogen atoms in the p-type InGaAlN layer 2 (inactivated) so that the p-type InGaAlN layer 2 has a high electric resistivity.

Figure 11B:
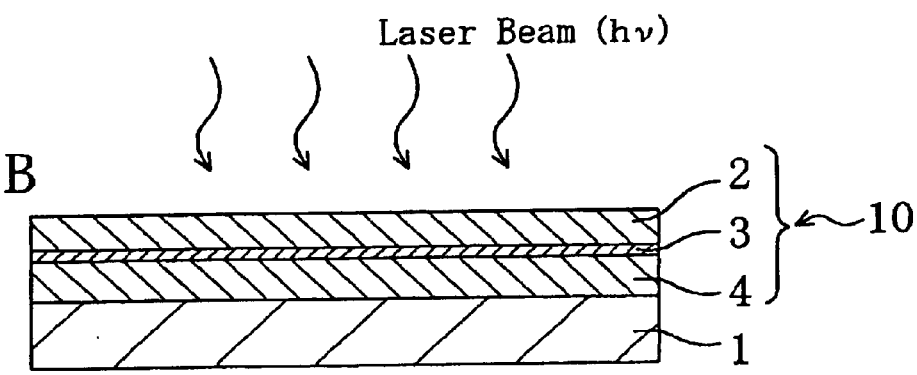

Next, in the step shown in FIG. 11B, irradiation is performed by applying a KrF excimer laser beam (luminous flux) (at a wavelength of 248 nm) from above the p-type InGaAlN layer 2 in a nitrogen atmosphere.

The power density and pulse width of the laser are adjusted to a level which does not decompose the InGaAlN layers 2, 3, and 4 and only the first-stage irradiation shown in FIG. 2 illustrating the first embodiment is performed. In short, a laser having a relatively low output and a large pulse width is used for irradiation. As a result, the p-type InGaAlN layer 2 absorbs the laser to be heated and hydrogen in the film is removed from the p-type InGaAlN layer 2 so that the resistance of the p-type InGaAlN layer 2 is reduced.

In this step, irradiation is performed such that the laser beam (luminous flux) scans the entire surface of the wafer. The entire wafer has been heated to about 500° C. for a reduction in in-film stress resulting from the different thermal expansion coefficients of the sapphire substrate 1 and the individual layers composing the multilayer portion 10. The heating temperature is preferably in the range of 400° C. to 750° C. such that the stress-reducing function is performed without inducing the degraded properties of the individual layers on the substrate and significant deformation thereof.

Figure 11C:
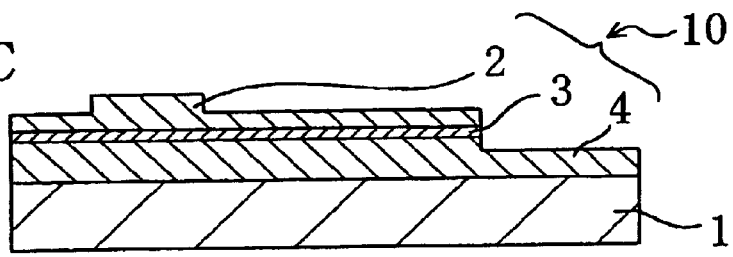

Then, in the step shown in FIG. 11C, each of the p-type InGaAlN layer 2, the InGaAlN active layer 3, and the n-type InGaAlN layer 4 is partly etched such that the portion of the n-type InGaAlN layer 4 serving as a contact region with an n-side ohmic electrode is exposed and that the p-type InGaAlN layer 2 is patterned into a configuration in which the portion serving as a contact region with a p-side ohmic electrode protrudes from the other portion.

Figure 11D:
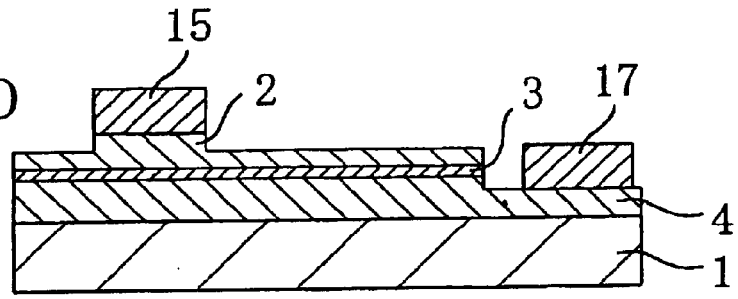

Then, in the step shown in FIG. 11D, a Ni/Au film, e.g., is deposited on the substrate and then patterned to form the p-side ohmic electrode 15 of a semiconductor laser on the protruding portion of the p-type InGaAlN layer 2. Subsequently, a heat treatment is performed in an $N_2$ or $O_2$ atmosphere at a temperature of about 600° C., thereby reducing the contact resistance between the ohmic electrode 15 and the p-type InGaAlN layer 2. Further, a Ti/Au film, e.g., is deposited on the substrate and then patterned to form the n-side ohmic electrode 17 on the exposed portion of the n-type InGaAlN layer 4 of the semiconductor laser. Thereafter, the semiconductor laser can be formed by using a conventionally well-known technique such as a chip cleaving step.

It is also possible to form a light-emitting diode by using the p-type InGaAlN layer 2, the InGaAlN active layer 3, and the n-type InGaAlN layer 4 in the multilayer portion 10.

Thus, the present embodiment achieves the reduction of the resistance of the p-type InGaAlN layer 2 as well as a reduction in the contact resistance between the p-type InGaAlN layer 2 and the p-side ohmic electrode 15 with irradiation with the laser. In reducing the resistance of the p-type InGaAlN layer 2, each of the layers composing the multilayer portion 10 is prevented from being heated to a high temperature by adjusting the energy and pulse width of the laser used for irradiation. By thus suppressing the diffusion of the dopants in the multilayer portion 10, the dopant profiles can retain sharpness. This allows a device having reduced power consumption due to the reduced contact resistance with the ohmic electrode and an excellent property (a light-emitting diode with an excellent light-emitting property or semiconductor laser having a low threshold current) to be implemented.

Embodiment 9

FIGS. 12A to 12D are cross-sectional views illustrating a method for fabricating a semiconductor device using a nitride semiconductor according to a ninth embodiment of the present invention.

Figure 12A:
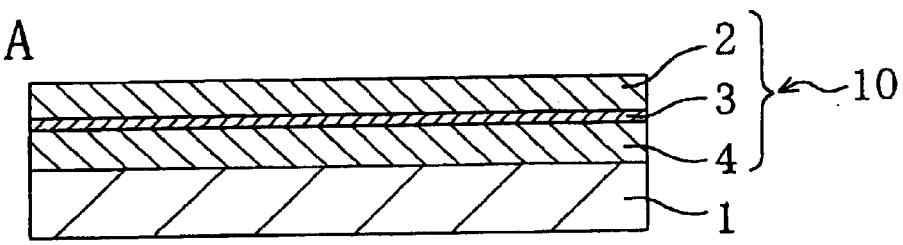
FIGS. 12A to 12D are cross-sectional views illustrating a method for fabricating a semiconductor device using a nitride semiconductor according to a ninth embodiment of the present invention.

First, in the step shown in FIG. 12A, an n-type InGaAlN layer 4 having a thickness of about 3 $\mu$m and having a composition represented by $(Al_xGa_{1-x})_yIn_{1-y}N$ ($0 \leq x \leq 1$, $0 \leq y \leq 1$) is formed on a sapphire substrate 1 (wafer) having a principal surface substantially coincident with the (0001) plane by, e.g., metal organic chemical vapor deposition (MOCVD). The n-type InGaAs layer 4 may also be formed after an amorphous AlN buffer layer (or a GaN buffer layer) as thin as about 50 nm is formed at a low temperature of, e.g., about 500° C. The n-type InGaAlN layer 4 includes an n-type GaN layer or an n-type AlGaN clad layer, though it is not depicted. Subsequently, an undoped InGaAlN active layer 3 having a composition represented by $(Al_xGa_{1-x})_yIn_{1-y}N$ ($0 \leq x \leq 1$, $0 \leq y \leq 1$) is formed on the p-type InGaAlN layer 2. The InGaAlN active layer 3 contains, e.g., an InGaN quantum well structure and serves as a region emitting blue or blue-purple light in response to the injection of a current if the semiconductor device is a light-emitting diode or a semiconductor laser. Subsequently, a p-type InGaAlN layer 2 having a thickness of about 0.5 $\mu$m and a composition represented by $(Al_xGa_{1-x})_yIn_{1-y}N$ ($0 \leq x \leq 1$, $0 \leq y \leq 1$) is formed on the p-type InGaAlN active layer 3. The p-type InGaAlN layer 2 includes a p-type AlGaN clad layer or a p-type GaN layer. By the foregoing process, a multilayer portion 10 composed of the p-type InGaAlN layer 2, the InGaAlN active layer 3, and the n-type InGaAlN layer 4 is formed.

In the foregoing process, Si and Mg have been added as dopants in forming the n-type layers and the p-type layers. When epitaxial growth is performed by MOCVD, a hydrogen gas is used as a carrier gas. In the as-grown state, Mg is bonded to hydrogen atoms in the p-type InGaAlN layer 2 (inactivated) so that the p-type InGaAlN layer 2 has a high electric resistivity.

Figure 12B:
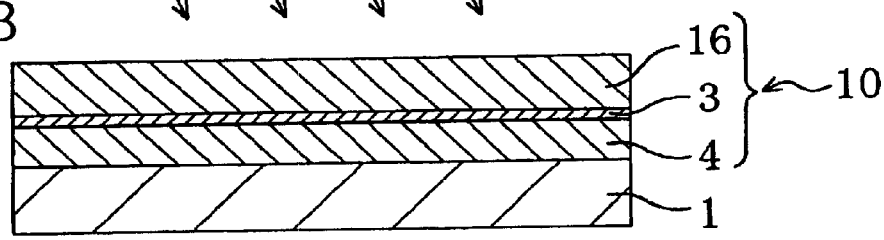

Next, in the step shown in FIG. 12B, irradiation is performed by applying a KrF excimer laser beam (luminous flux) (at a wavelength of 248 nm) from above the p-type InGaAlN layer 2 in a nitrogen atmosphere.

The power density and pulse width of the laser is adjusted to a level which decomposes or denatures the p-type InGaAlN layer 2 and each of the first-stage and second-stage irradiations shown in FIG. 2 illustrating the first embodiment is performed. As a result, the p-type InGaAlN layer 2 absorbs the laser to be heated so that hydrogen is removed from the film, the p-type InGaAlN layer 2 is decomposed or denatured, and a low-resistance GaN layer 16 in which the composition ratio of N is low is formed. In the surface portion of the low-resistance GaN layer 16, a thin metal Ga layer hardly containing N is formed.

In this step, irradiation is performed such that the laser beam (luminous flux) scans the entire surface of the wafer. The entire wafer has been heated to about 500° C. for a reduction in in-film stress resulting from the different thermal expansion coefficients of the sapphire substrate 1 and the individual layers composing the multilayer portion 10. The heating temperature is preferably in the range of 400° C. to 750° C. such that the stress-reducing function is performed without inducing the degraded properties of the individual layers on the substrate and significant deformation thereof.

Figure 12C:
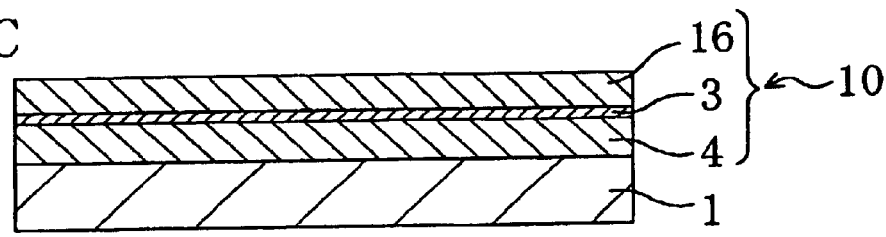

Then, in the step shown in FIG. 12C, a surface portion of the low-resistance GaN layer 16 is etched by using an acid such as HCl, whereby the metal Ga layer having a relatively high resistance that was formed when the p-type InGaAlN layer 2 was decomposed or denatured to be changed into the low-resistance GaN layer 16 in the step shown in FIG. 12B was removed. However, surface roughness is still observed at the low-resistance GaN layer 16 after the etching.

Figure 12D:
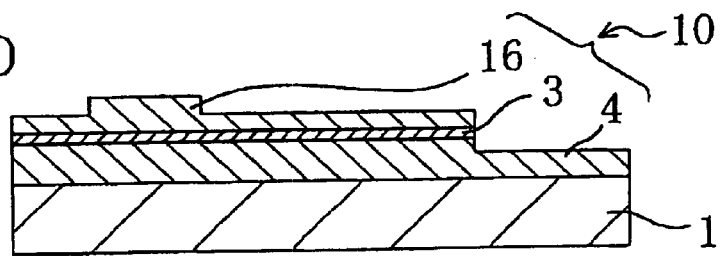

Next, in the step shown in FIG. 12D, each of the low-resistance GaN layer 16, the InGaAlN active layer 3, and the n-type InGaAlN layer 4 is partly etched such that the portion of the n-type InGaAlN layer 4 serving as a contact region with an n-side ohmic electrode is exposed and that the low-resistance GaN layer 16 is patterned into a configuration in which the portion serving as a contact region with a p-side ohmic electrode protrudes from the other portion. Thereafter, a semiconductor laser or a light-emitting diode can be formed by using a conventionally well-known technique.

Figure 13:
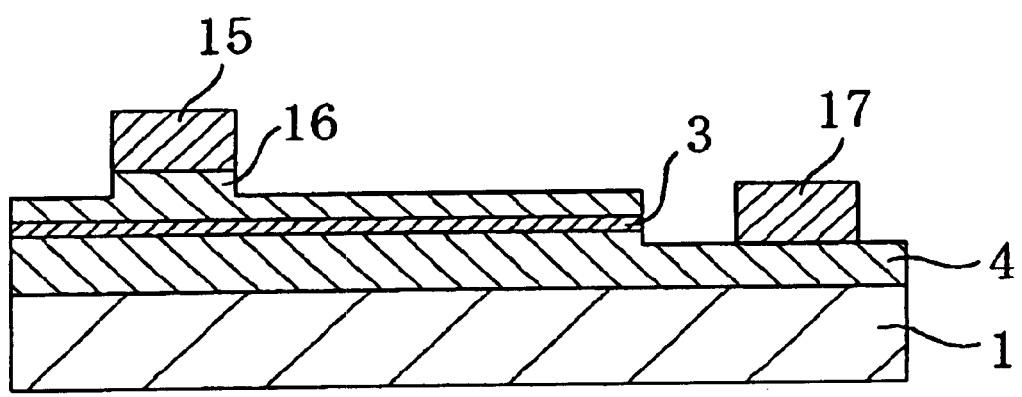
FIG. 13 is a cross-sectional view showing a structure of a semiconductor laser formed by fabrication process steps according to the ninth embodiment.

FIG. 13 is a cross-sectional view showing a structure of a semiconductor laser formed by fabrication process steps according to the ninth embodiment. The structure is formed by the following process.

After the step shown in FIG. 12D, a Ni/Au film, e.g., is deposited on the substrate and then patterned to form the p-side ohmic electrode 15 of the semiconductor laser on the protruding portion of the low-resistance GaN layer 16. Subsequently, a heat treatment is performed in an $N_2$ or $O_2$ atmosphere at a temperature of about 600° C., thereby reducing the contact resistance between the p-side ohmic electrode 15 and the low-resistance GaN layer 16. Since the low-resistance GaN layer 16 still exhibits the surface roughness, a contact area between the low-resistance GaN layer 16 and the p-side ohmic electrode 15 increases so that the effect of reducing the contact resistance becomes particularly prominent.

Further, a Ti/Al film, e.g., is deposited on the substrate and then patterned to form the n-side ohmic electrode 17 of the semiconductor laser on the exposed portion of the n-type InGaAlN layer 4. Thereafter, the semiconductor laser can be formed by using a conventionally well-known technique such as a chip cleaving step.

It is also possible to form a light-emitting diode by using the low-resistance GaN layer 16, the InGaAlN active layer 3, and the n-type InGaAlN layer 4 shown in FIG. 13.

Thus, the present embodiment has formed the low-resistance GaN layer 16 by decomposing or denaturing the p-type InGaAlN layer 2 with irradiation with the laser and thereby achieved a reduction in the contact resistance between the low-resistance GaN layer 16 and the ohmic electrode 15.

The reason for the low contact resistance between the low-resistance GaN layer 16 formed by decomposing or denaturing the p-type InGaAlN layer 2 and the ohmic electrode has not been elucidated as yet. However, the causes for the effect of reducing the contact resistance can be assumed as follows. The first assumed cause is the increased contact area between the low-resistance GaN layer 16 and the ohmic electrode due to the surface roughness of the low-resistance GaN layer 16 described above. The second assumed cause is a reduced optical band gap resulting from the deviation of the composition of the GaN layer from its stoichiometric value, which may have reduced the resistance in ohmic contact with the electrode as a conductor.

Thus, a device having reduced power consumption due to the reduced contact resistance with the ohmic electrode (a light-emitting diode with an excellent light-emitting property or a semiconductor laser having a low threshold current) can be implemented.

Embodiment 10

FIGS. 14A to 14D are cross-sectional views illustrating a method for fabricating a semiconductor device using a nitride semiconductor according to a tenth embodiment of the present invention.

Figure 14A:
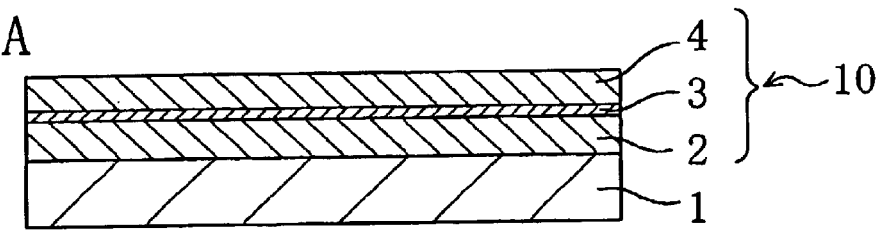
FIGS. 14A to 14D are cross-sectional views illustrating a method for fabricating a semiconductor device using a nitride semiconductor according to a tenth embodiment of the present invention.

First, in the step shown in FIG. 14A, a p-type InGaAlN layer 2 having a thickness of about 3 $\mu$m and a composition represented by $(Al_xGa_{1-x})_yIn_{1-y}N$ ($0 \leq x \leq 1$, $0 \leq y \leq 1$) is formed on a sapphire substrate 1 (wafer) having a principal surface substantially coincident with the (0001) plane by, e.g., metal organic chemical vapor deposition (MOCVD). The p-type InGaAs layer 2 may also be formed after an amorphous AlN buffer layer (or a GaN buffer layer) as thin as about 50 nm is formed at a low temperature of, e.g., about 500° C. The p-type InGaAlN layer 2 includes a p-type GaN layer or a p-type AlGaN clad layer, though it is not depicted. Subsequently, an undoped InGaAlN active layer 3 having a composition represented by $(Al_xGa_{1-x})_yIn_{1-y}N$ ($0 \leq x \leq 1$, $0 \leq y \leq 1$) is formed on the p-type InGaAlN layer 2. The InGaAlN active layer 3 contains, e.g., an InGaN quantum well structure and serves as a region emitting blue or blue-purple light in response to the injection of a current if the semiconductor device is a light-emitting diode or a semiconductor laser.

Subsequently, an n-type InGaAlN layer 4 having a thickness of about 0.5 $\mu$m and a composition represented by $(Al_xGa_{1-x})_yIn_{1-y}N$ ($0 \leq x \leq 1$, $0 \leq y \leq 1$) is formed on the p-type InGaAlN active layer 3. The n-type InGaAlN layer 4 includes an n-type AlGaN clad layer or an n-type GaN layer. By the foregoing process, a multilayer portion 10 composed of the p-type InGaAlN layer 2, the InGaAlN active layer 3, and the n-type InGaAlN layer 4 is formed.

In the foregoing process, Si and Mg have been added as dopants in forming the n-type layers and the p-type layers, respectively. When epitaxial growth is performed by MOCVD, a hydrogen gas is used as a carrier gas. In the as-grown state, Mg is bonded to hydrogen atoms in the p-type InGaAlN layer 2 and hence a p-type impurity in the p-type InGaAlN layer 2 is inactivated so that the p-type InGaAlN layer 2 has a high electric resistivity.

Figure 14B:
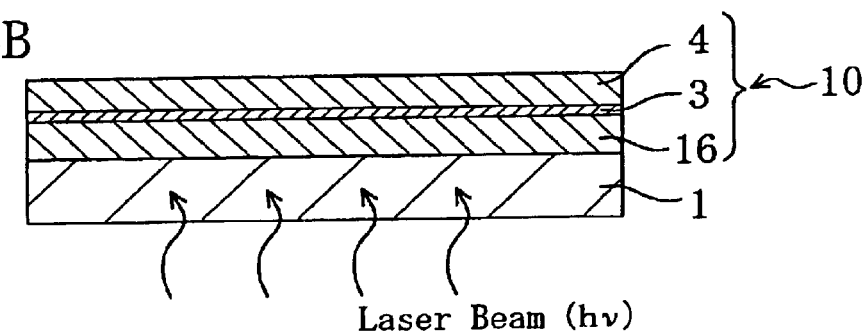

Next, in the step shown in FIG. 14B, the back surface of the sapphire substrate 1 is irradiated with a KrF excimer laser beam (luminous flux) (at a wavelength of 248 nm) in a nitrogen atmosphere.

The power density and pulse width of the laser is adjusted to a level which decomposes the p-type InGaAlN layer 2 and each of the first-stage and second-stage irradiations shown in FIG. 2 illustrating the first embodiment is performed. As a result, the p-type InGaAlN layer 2 absorbs the laser to be heated so that hydrogen is removed from the film, the p-type InGaAlN layer 2 is decomposed or denatured, and a low-resistance GaN layer 16 in which the composition ratio of N is low is formed. In the surface portion of the low-resistance GaN layer 16, a thin metal Ga layer hardly containing N is formed.

In this step, irradiation is performed such that the laser beam (luminous flux) scans the entire surface of the wafer. The entire wafer has been heated to about 500° C. for a reduction in in-film stress resulting from the different thermal expansion coefficients of the sapphire substrate 1 and the individual layers composing the multilayer portion 10. The heating temperature is preferably in the range of 400° C. to 750° C. such that the stress-reducing function is performed without incurring the degraded properties of the individual layers on the substrate and significant deformation thereof.

Figure 14C:
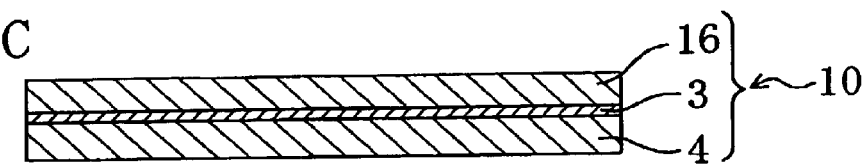

Then, in the step shown in FIG. 14C, the sapphire substrate 1 is separated (substrate separation) from the multilayer portion 10 (including the low-resistance GaN layer 16, the InGaAlN active layer 3, and the n-type InGaAlN layer 4). Then, a surface portion of the low-resistance GaN layer 16 is etched by using an acid such as HCl, whereby the metal Ga layer formed when the p-type InGaAlN layer 2 was decomposed or denatured to be changed into the low-resistance GaN layer 16 in the step shown in FIG. 14B is removed. However, surface roughness is still observed at the low-resistance GaN layer 16 after the etching.

Figure 14D:
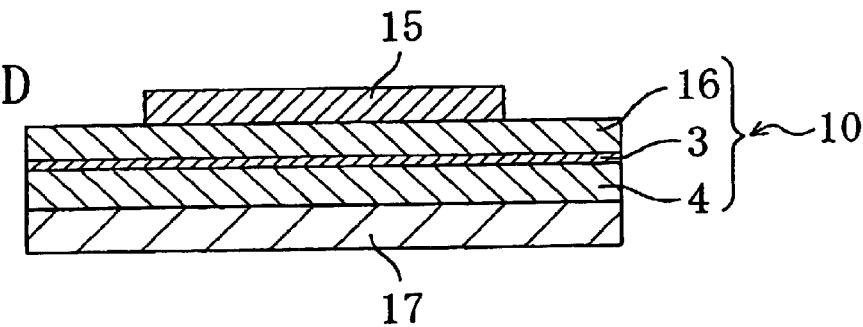

Next, in the step shown in FIG. 14D, a Ni/Au film, e.g., is deposited on the low-resistance GaN layer 16 and patterned to form the p-side ohmic electrode 15 of a light-emitting diode. Subsequently, a heat treatment is performed in an $N_2$ or $O_2$ atmosphere at a temperature of about 600° C., thereby reducing the contact resistance between the p-side ohmic electrode 15 and the low-resistance GaN layer 16. Since the low-resistance GaN layer 16 still exhibits the surface roughness, a contact area between the low-resistance GaN layer 16 and the p-side ohmic electrode 15 increases so that the effect of reducing the contact resistance becomes prominent. It is to be noted that the etching of the metal Ga layer 16 need not necessarily be performed.

Further, a Ti/Al film, e.g., is deposited on the lower surface of the n-type InGaAlN layer 4 to form the n-side ohmic electrode 17 of the light-emitting diode.

Thus, the present embodiment has also formed the low-resistance GaN layer 16 by decomposing or denaturing the p-type InGaAlN layer 2 with irradiation with the laser beam and thereby achieved a reduction in the contact resistance between the low-resistance GaN layer 16 and the ohmic electrode 15 by the same effects achieved by the ninth embodiment. This implements a device having reduced power consumption due to the reduced contact resistance with the ohmic electrode 15 (a light-emitting diode with an excellent light-emitting property or a semiconductor laser having a low threshold current).

Other Embodiments

Although each of the foregoing embodiments has used the sapphire substrate as the single-crystal substrate, the single-crystal substrate according to the present invention is not limited thereto. As the single-crystal substrate, there can be used an SiC substrate, an MgO substrate, an $LiGaO_2$ substrate, an $LiGa_xAl_{1-x}O_2$ ($0 \leq x \leq 1$) mixed-crystal substrate, or an $LiAlO_2$ substrate.

As the recipient substrate, there can be used a GaAs substrate, a GaP substrate, an InP substrate, or the like instead of the Si substrate.

What is claimed is:

1. A method for fabricating a semiconductor device having a semiconductor layer formed by epitaxial growth from a single-crystal substrate, the method comprising the steps of:
   (a) forming a multilayer film having at least a first semiconductor layer composed of a group III-V compound doped with a p-type impurity and containing nitrogen and an n-type second semiconductor layer composed of a group III-V compound doped with an n-type impurity and containing nitrogen such that the single-crystal substrate is covered with the multilayer film; and
   (b) irradiating the first semiconductor layer with a light beam to activate the p-type impurity in the first semiconductor layer, wherein
   the step (a) includes forming the first semiconductor layer below the second semiconductor layer and
   the step (b) includes irradiating the first semiconductor layer with the light beam through a back surface of the single-crystal substrate, wherein the step (b) includes performing a first-stage treatment for activating the p-type impurity in the first semiconductor layer and performing a second-stage treatment for varying a power density or energy of the light beam to separate the first semiconductor layer and the single-crystal substrate from each other.

2. The method of claim 1, further comprising, after the first-stage treatment in the step (b) and prior to the second-stage treatment, the step of: fixing a recipient substrate onto the multilayer structure.

3. A method for fabricating a semiconductor device having a semiconductor layer formed by epitaxial growth from a single-crystal substrate, the method comprising the steps of:
   (a) forming a multilayer film having at least a first semiconductor layer composed of a group III-V compound doped with a p-type impurity and containing nitrogen and an n-type second semiconductor layer composed of a group III-V compound doped with an n-type impurity and containing nitrogen such that the single-crystal substrate is covered with the multilayer film; and
   (b) irradiating the first semiconductor layer with a light beam to activate the p-type impurity in the first semiconductor layer, wherein
   the step (a) includes forming the first semiconductor layer below the second semiconductor layer and
   the step (b) includes irradiating the first semiconductor layer with the light beam through a back surface of the single-crystal substrate, wherein
   the step (b) includes decomposing or denaturing the first semiconductor layer to form a conductor layer, the method further comprising, after the step (b), the step of:
   forming an ohmic electrode composed of a conductor material on the conductor layer.

4. The method of claim 3, further comprising, after the step (b) and prior to the formation of the ohmic electrode, the step of:
   etching a surface portion of the conductor layer.

5. A method for fabricating a semiconductor device having a semiconductor layer formed by epitaxial growth from a single-crystal substrate, the method comprising the steps of:
   (a) forming a multilayer film having at least a first semiconductor layer composed of a group III-V compound doped with a p-type impurity and containing nitrogen and an n-type second semiconductor layer composed of a group III-V compound doped with an n-type impurity and containing nitrogen such that the single-crystal substrate is covered with the multilayer film; and
   (b) irradiating the first semiconductor layer with a light beam to activate the p-type impurity in the first semiconductor layer, wherein
   the step (a) includes forming the first semiconductor layer below the second semiconductor layer and
   the step (b) includes irradiating the first semiconductor layer with the light beam through a back surface of the single-crystal substrate, said method further comprising, prior to the step (a), the step of:
   forming, on the single-crystal substrate, a spacer layer having an optical band gap smaller than an optical band gap of the single-crystal substrate, wherein
   the step (a) includes forming the multilayer film on the spacer layer and
   the step (b) includes activating the p-type impurity in the first semiconductor layer and separating the spacer layer and the single-crystal substrate from each other.

6. A method for fabricating a semiconductor device having a semiconductor layer formed by epitaxial growth from a single-crystal substrate, the method comprising the steps of:
   (a) forming a multilayer film having at least a first semiconductor layer composed of a group III-V compound doped with a p-type impurity and containing nitrogen and an n-type second semiconductor layer composed of a group III-V compound doped with an n-type impurity and containing nitrogen such that the single-crystal substrate is covered with the multilayer film; and
   (b) irradiating the first semiconductor layer with a light beam to activate the p-type impurity in the first semiconductor layer, wherein
   the step (a) includes forming the first semiconductor layer above the second semiconductor layer and
   the step (b) includes irradiating the first semiconductor layer with the light beam from above the first semiconductor layer.

7. The method of claim 6, further comprising, after the step (a), the step of:
   forming a cap layer on the multilayer portion, wherein
   the step (b) includes irradiating the first semiconductor layer with the light beam from above the cap layer.

8. The method of claim 7, further comprising the steps of:
   after the step (b), removing the cap layer;
   fixing a recipient substrate onto the multilayer portion; and
   after or prior to the fixation of the recipient substrate, irradiating a back surface of the single-crystal substrate with a light beam to separate the single-crystal substrate from the multilayer portion.

9. The method of claim 8, wherein the light beam used to irradiate the back surface of the substrate is higher in energy than the light beam used for the irradiation from above the multilayer portion in the step (b).

10. The method of claim 6, further comprising: after the step (b), forming an ohmic electrode composed of a conductor material on the first semiconductor layer.

11. The method of claim 6, wherein
the step (b) includes decomposing or denaturing the first semiconductor layer to form a conductor layer, the method further comprising the step of:
after the step (b), forming an ohmic electrode composed of a conductor material on the conductor layer.

12. The method of claim 11, further comprising:
after the step (b) and prior to the formation of the ohmic electrode, etching a surface portion of the conductor layer.

13. A method for fabricating a semiconductor device having a semiconductor layer formed by epitaxial growth from a single-crystal substrate, the method comprising the steps of:
(a) forming a multilayer film having at least a first semiconductor layer composed of a group III-V compound doped with a p-type impurity and containing nitrogen and an n-type second semiconductor layer composed of a group III-V compound doped with an n-type impurity and containing nitrogen such that the single-crystal substrate is covered with the multilayer film; and
(b) irradiating the first semiconductor layer with a light beam to activate the p-type impurity in the first semiconductor layer, wherein
the step (a) includes forming the multilayer portion such that it further has an n-type third semiconductor layer opposing the second semiconductor layer with the first semiconductor layer interposed therebetween and having an optical band gap different from an optical band gap of the first semiconductor layer.

14. The method of claim 13, wherein the optical band gap of the third semiconductor layer is larger than the optical band gap of the first semiconductor layer and larger than an energy of the light beam.

15. The method of claim 13, wherein a collector region of a bipolar transistor is formed from the first semiconductor layer, a base region of the bipolar transistor is formed from the second semiconductor layer, and an emitter region of the bipolar transistor is formed from the third semiconductor layer.

16. The method of claim 15, wherein an optical band gap of the emitter region is adjusted to be larger than an optical band gap of the base region.

17. A method for fabricating a semiconductor device having a semiconductor layer formed by epitaxial growth from a single-crystal substrate, the method comprising the steps of:
(a) forming a multilayer film having at least a first semiconductor layer composed of a group III-V compound doped with a p-type impurity and containing nitrogen and an n-type second semiconductor layer composed of a group III-V compound doped with an n-type impurity and containing nitrogen such that the single-crystal substrate is covered with the multilayer film; and
(b) irradiating the first semiconductor layer with a light beam to activate the p-type impurity in the first semiconductor layer, wherein the step (b) is performed in an inert gas atmosphere or in an atmosphere under a reduced pressure.

18. A method for fabricating a semiconductor device having a semiconductor layer formed by epitaxial growth from a single-crystal substrate, the method comprising the steps of:
(a) forming a multilayer film having at least a first semiconductor layer composed of a group III-V compound doped with a p-type impurity and containing nitrogen and an n-type second semiconductor layer composed of a group III-V compound doped with an n-type impurity and containing nitrogen such that the single-crystal substrate is covered with the multilayer film; and
(b) irradiating the first semiconductor layer with a light beam to activate the p-type impurity in the first semiconductor layer, wherein the light beam used in activating the p-type impurity in the first semiconductor layer has an energy smaller than an optical band gap of the second semiconductor layer.

19. A method for fabricating a semiconductor device having a semiconductor layer formed by epitaxial growth from a single-crystal substrate, the method comprising the steps of:
(a) forming a multilayer film having at least a first semiconductor layer composed of a group III-V compound doped with a p-type impurity and containing nitrogen and an n-type second semiconductor layer composed of a group III-V compound doped with an n-type impurity and containing nitrogen such that the single-crystal substrate is covered with the multilayer film; and
(b) irradiating the first semiconductor layer with a light beam to activate the p-type impurity in the first semiconductor layer, wherein the single-crystal substrate is heated during the irradiation with the light beam, wherein a heating temperature in heating the single-crystal substrate is in the range of 400° C. to 750° C.

20. A method for fabricating a semiconductor device having a semiconductor layer formed by epitaxial growth from a single-crystal substrate, the method comprising the steps of:
(a) forming a multilayer film having at least a first semiconductor layer composed of a group III-V compound doped with a p-type impurity and containing nitrogen and an n-type second semiconductor layer composed of a group III-V compound doped with an n-type impurity and containing nitrogen such that the single-crystal substrate is covered with the multi layer film; and
(b) irradiating the first semiconductor layer with a light beam to activate the p-type impurity in the first semiconductor layer, wherein the irradiation with the light beam is performed such that a luminous flux scans an entire surface of the single-crystal substrate.

21. A method for fabricating a semiconductor device having a semiconductor layer formed by epitaxial growth from a single-crystal substrate, the method comprising the steps of:
(a) forming a multilayer film having at least a first semiconductor layer composed of a group III-V compound doped with a p-type impurity and containing nitrogen and an n-type second semiconductor layer composed of a group III-V compound doped with an n-type impurity and containing nitrogen such that the single-crystal substrate is covered with the multilayer film; and
(b) irradiating the first semiconductor layer with a light beam to activate the p-type impurity in the first semiconductor layer, wherein the step (a) includes using Mg or Be as a dopant in forming the first semiconductor layer.

22. A method for fabricating a semiconductor device having a semiconductor layer formed by epitaxial growth from a single-crystal substrate, the method comprising the steps of:

(a) forming a multilayer film having at least a first semiconductor layer composed of a group III-V compound doped with a p-type impurity and containing nitrogen and an n-type second semiconductor layer composed of a group III-V compound doped with an n-type impurity and containing nitrogen such that the single-crystal substrate is covered with the multilayer film; and (b) irradiating the first semiconductor layer with a light beam to activate the p-type impurity in the first semiconductor layer, wherein the step (a) includes forming the first semiconductor layer in an atmosphere containing hydrogen.

23. A method for fabricating a semiconductor device having a semiconductor layer formed by epitaxial growth from a single-crystal substrate, the method comprising the steps of:

(a) forming a multilayer film having at least a first semiconductor layer composed of a group III-V compound doped with a p-type impurity and containing nitrogen and an n-type second semiconductor layer composed of a group III-V compound doped with an n-type impurity and containing nitrogen such that the single-crystal substrate is covered with the multilayer film; and (b) irradiating the first semiconductor layer with a light beam to activate the p-type impurity in the first semiconductor layer, wherein a substrate selected from a sapphire substrate, an SiC substrate, an MgO substrate, an $LiGaO_2$ substrate, an $LiGa_xAl_{1-x}O_2$ ($0 \leq x \leq 1$) mixed crystal substrate, and an $LiAlO_2$ substrate is used as the single-crystal substrate.

* * * * *